United States Patent
Heo et al.

(10) Patent No.: US 11,869,909 B2
(45) Date of Patent: Jan. 9, 2024

(54) IMAGE SENSORS AND ELECTRONIC DEVICES

(71) Applicant: Samsung Electronics Co., Ltd., Suwon-si (KR)

(72) Inventors: Chul Joon Heo, Busan (KR); Kyung Bae Park, Hwaseong-si (KR); Sung Young Yun, Suwon-si (KR); Seon-Jeong Lim, Yongin-si (KR); Feifei Fang, Suwon-si (KR); Taejin Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 349 days.

(21) Appl. No.: 17/336,750

(22) Filed: Jun. 2, 2021

(65) Prior Publication Data

US 2022/0020794 A1   Jan. 20, 2022

(30) Foreign Application Priority Data

Jul. 20, 2020   (KR) .......................... 10-2020-0089588

(51) Int. Cl.
*H01L 27/146* (2006.01)
(52) U.S. Cl.
CPC .. *H01L 27/14621* (2013.01); *H01L 27/14607* (2013.01); *H01L 27/14618* (2013.01); *H01L 27/14643* (2013.01)
(58) Field of Classification Search
CPC .............................................. H01L 27/14621
See application file for complete search history.

(56) References Cited

U.S. PATENT DOCUMENTS

| | | | |
|---|---|---|---|
| 7,262,404 B2 * | 8/2007 | Yamaguchi | ....... H01L 27/14627 257/E31.127 |
| 7,400,023 B2 * | 7/2008 | Watanabe | ......... H01L 27/14692 257/E31.124 |

(Continued)

FOREIGN PATENT DOCUMENTS

| | | |
|---|---|---|
| JP | 5556823 B2 | 7/2014 |
| KR | 10-1447113 B1 | 10/2014 |

(Continued)

*Primary Examiner* — David A Zarneke
(74) *Attorney, Agent, or Firm* — Harness, Dickey & Pierce, P.L.C.

(57) ABSTRACT

An image sensor may include a substrate, and a plurality of wavelength separation filters on the substrate and arranged along an in-plane direction of the substrate. The wavelength separation filters include a first wavelength separation filter configured to selectively transmit incident light in the first wavelength spectrum, and photoelectrically convert the incident light in at least one of the second wavelength spectrum or the third wavelength spectrum, a second wavelength separation filter configured to selectively transmit the incident light in the second wavelength spectrum and photoelectrically convert the incident light in at least one of the first wavelength spectrum or the third wavelength spectrum, and a third wavelength separation filter configured to selectively transmit the incident light in the third wavelength spectrum and photoelectrically convert the incident light in at least one of the first wavelength spectrum or the second wavelength spectrum.

34 Claims, 8 Drawing Sheets

(56) References Cited

U.S. PATENT DOCUMENTS

| | | |
|---|---|---|
| 8,610,129 B2 | 12/2013 | Nam et al. |
| 9,385,148 B2 | 7/2016 | Murata |
| 9,455,302 B2 * | 9/2016 | Lee ........................ H10K 30/82 |
| 9,502,472 B2 | 11/2016 | Kim |
| 9,524,998 B2 | 12/2016 | Kim |
| 9,654,709 B2 | 5/2017 | Murata |
| 9,748,295 B2 * | 8/2017 | Lee ................... H01L 27/14647 |
| 9,860,438 B2 | 1/2018 | Nakata |
| 10,043,840 B2 | 8/2018 | Jin et al. |
| 10,115,752 B2 * | 10/2018 | Azami ................... H04N 25/70 |
| 10,186,544 B2 * | 1/2019 | Lee .................... H01L 27/1461 |
| 10,367,992 B2 | 7/2019 | Nakata |
| 10,535,687 B2 * | 1/2020 | Azami ................ H01L 27/1463 |
| 10,554,876 B2 | 2/2020 | Nakata |
| 10,559,620 B2 | 2/2020 | Seki et al. |
| 10,566,557 B2 * | 2/2020 | Yamaguchi ....... H01L 27/14636 |
| 10,674,102 B2 | 6/2020 | Murata |
| 10,847,581 B2 * | 11/2020 | Yamaguchi ........... H01L 27/146 |
| 10,979,680 B2 * | 4/2021 | Lee ........................ H04N 25/17 |
| 2009/0179291 A1 | 7/2009 | Nam et al. |
| 2016/0247860 A1 * | 8/2016 | Ito ......................... H10K 39/32 |
| 2019/0245009 A1 | 8/2019 | Lee et al. |
| 2019/0319058 A1 | 10/2019 | Imoto et al. |
| 2020/0128172 A1 | 4/2020 | Nakata |
| 2020/0236312 A1 | 7/2020 | Murata |

FOREIGN PATENT DOCUMENTS

| | | |
|---|---|---|
| KR | 10-2015-0135208 A | 12/2015 |
| KR | 10-2015-0141035 A | 12/2015 |
| KR | 10-1653744 B1 | 9/2016 |
| KR | 10-1980199 B1 | 5/2019 |
| KR | 10-2019-0095087 A | 8/2019 |

* cited by examiner

IMAGE SENSORS AND ELECTRONIC DEVICES

CROSS-REFERENCE TO RELATED APPLICATION

This application claims priority to and the benefit of Korean Patent Application No. 10-2020-0089588 filed in the Korean Intellectual Property Office on Jul. 20, 2020, the entire contents of which are incorporated herein by reference.

BACKGROUND

1. Field

Image sensors and electronic devices are disclosed.

2. Description of the Related Art

An imaging device such as a camera captures an image and stores the captured image as an electrical signal. The imaging device includes an image sensor that decomposes (e.g., filters) incident light according to a wavelength to convert each component (e.g., each wavelength component of the incident light) into an electrical signal.

SUMMARY

Some example embodiments provide an image sensor capable of improving light loss and crosstalk.

Some example embodiments provide an electronic device including the image sensor.

According to some example embodiments, an image sensor is configured to obtain an image based on combining image signals obtained based on photoelectric conversion of incident light in a first wavelength spectrum of a visible wavelength spectrum, a second wavelength spectrum of the visible wavelength spectrum, and a third wavelength spectrum of the visible wavelength spectrum. The image sensor may include a substrate and a plurality of wavelength separation filters on the substrate. The plurality of wavelength separation filters may be arranged along an in-plane direction of the substrate, the in-plane direction of the substrate extending in parallel with an upper surface of the substrate. The plurality of wavelength separation filters may include a first wavelength separation filter configured to selectively transmit the incident light in the first wavelength spectrum, and photoelectrically convert the incident light in at least one of the second wavelength spectrum or the third wavelength spectrum. The plurality of wavelength separation filters may include a second wavelength separation filter configured to selectively transmit the incident light in the second wavelength spectrum, and photoelectrically convert the incident light in at least one of the first wavelength spectrum or the third wavelength spectrum. The plurality of wavelength separation filters may include a third wavelength separation filter configured to selectively transmit the incident light in the third wavelength spectrum, and photoelectrically convert the incident light in at least one of the first wavelength spectrum or the second wavelength spectrum.

Each of the first wavelength separation filter, the second wavelength separation filter, and the third wavelength separation filter may include one or more photoelectric conversion materials.

The first wavelength separation filter may include at least one first photoelectric conversion material configured to absorb the incident light in the at least one of the second wavelength spectrum or the third wavelength spectrum. The second wavelength separation filter includes at least one second photoelectric conversion material configured to absorb the incident light in the at least one of the first wavelength spectrum or the third wavelength spectrum. The third wavelength separation filter may include at least one third photoelectric conversion material configured to absorb the incident light in the at least one of the first wavelength spectrum or the second wavelength spectrum. The first photoelectric conversion material, the second photoelectric conversion material, and the third photoelectric conversion material may independently include a p-type semiconductor, an n-type semiconductor, or a combination of a p-type semiconductor and an n-type semiconductor. Each of the first wavelength separation filter, the second wavelength separation filter and the third wavelength separation filter may further include a colorant.

The first wavelength separation filter may include at least one first colorant configured to selectively transmit the incident light in the first wavelength spectrum, the second wavelength separation filter may include at least one second colorant configured to selectively transmit the incident light in the second wavelength spectrum, and the third wavelength separation filter may include at least one third colorant configured to selectively transmit the incident light in the third wavelength spectrum.

Each of the first wavelength separation filter, the second wavelength separation filter and the third wavelength separation filter may further include at least one of a cross-linked polymer or a binder.

The first wavelength separation filter may include at least one first colorant configured to selectively transmit the incident light in the first wavelength spectrum and at least one first photoelectric conversion material configured to absorb the incident light in the at least one of the second wavelength spectrum or the third wavelength spectrum. The second wavelength separation filter may include at least one second colorant configured to selectively transmit the incident light in the second wavelength spectrum and at least one second photoelectric conversion material configured to absorb the incident light in the at least one of the first wavelength spectrum or the third wavelength spectrum. The third wavelength separation filter may include at least one third colorant configured to selectively transmit the incident light in the third wavelength spectrum and at least one third photoelectric conversion material configured to absorb the incident light in the at least one of the first wavelength spectrum or the second wavelength spectrum.

The first wavelength separation filter may include a mixture of the first colorant and the first photoelectric conversion material, the second wavelength separation filter may include a mixture of the second colorant and the second photoelectric conversion material, and the third wavelength separation filter may include a mixture of the third colorant and the third photoelectric conversion material.

The first wavelength separation filter may include a first layer that includes the first colorant and a second layer that includes the first photoelectric conversion material, the second wavelength separation filter may include a third layer that includes the second colorant and a fourth layer that includes the second photoelectric conversion material, and the third wavelength separation filter may include a fifth layer that includes the third colorant and a sixth layer that includes the third photoelectric conversion material.

The image sensor may further include a light-transmitting electrode that is between the first layer and the second layer, between the third layer and the fourth layer, and between the fifth layer and the sixth layer.

The image sensor may further include an electrode configured to transfer electric charges generated based on photoelectric conversion in the plurality of wavelength separation filters.

The image sensor may further include a photodiode within the substrate, the photodiode overlapping at least one wavelength separation filter of the plurality of wavelength separation filters in a vertical direction that extends perpendicular to the upper surface of the substrate, a first signal processor electrically connected to the photodiode, and a second signal processor electrically connected to the at least one wavelength separation filter.

The first signal processor and the second signal processor may be configured to generate separate, respective image signals that are configured to be combined to generate the image.

The first wavelength separation filter may be configured to selectively transmit the incident light in a blue wavelength spectrum and photoelectrically convert the incident light in both a green wavelength spectrum and a red wavelength spectrum, the second wavelength separation filter may be configured to selectively transmit the incident light in the green wavelength spectrum and photoelectrically convert the incident light in both the blue wavelength spectrum and the red wavelength spectrum, and the third wavelength separation filter may be configured to selectively transmit the incident light in the red wavelength spectrum and photoelectrically convert the incident light in both the blue wavelength spectrum and the green wavelength spectrum.

The first wavelength separation filter may be configured to photoelectrically convert the incident light in a green wavelength spectrum and selectively transmit the incident light in both a blue wavelength spectrum and a red wavelength spectrum, the second wavelength separation filter may be configured to photoelectrically convert the incident light in the red wavelength spectrum and selectively transmit the incident light in both the green wavelength spectrum and the blue wavelength spectrum, and the third wavelength separation filter may be configured to photoelectrically convert the incident light in the blue wavelength spectrum and selectively transmit the incident light in both the red wavelength spectrum and the green wavelength spectrum.

The first wavelength separation filter may be configured to photoelectrically convert the incident light in a red wavelength spectrum and selectively transmit the incident light in both a blue wavelength spectrum and a green wavelength spectrum, the second wavelength separation filter may be configured to photoelectrically convert the incident light in the blue wavelength spectrum and selectively transmit the incident light in both the green wavelength spectrum and the red wavelength spectrum, and the third wavelength separation filter may be configured to photoelectrically convert the incident light in the green wavelength spectrum and selectively transmit the incident light in both the blue wavelength spectrum and the red wavelength spectrum.

According to some example embodiments, an image sensor may include a first sensor including first, second, and third photodiodes, and a second sensor. The second sensor may include a first wavelength separation filter overlapping the first photodiode in a vertical direction extending perpendicular to an upper surface of a substrate of the image sensor, a second wavelength separation filter overlapping the second photodiode in the vertical direction, and a third wavelength separation filter overlapping the third photodiode in the vertical direction, wherein the first wavelength separation filter includes at least one first colorant configured to selectively transmit incident light in a first wavelength spectrum and at least one first photoelectric conversion material configured to absorb the incident light in at least one of a second wavelength spectrum or a third wavelength spectrum. The second wavelength separation filter may include at least one second colorant configured to selectively transmit the incident light in the second wavelength spectrum and at least one second photoelectric conversion material configured to absorb the incident light in at least one of the first wavelength spectrum or the third wavelength spectrum. The third wavelength separation filter may include at least one third colorant configured to selectively transmit the incident light in the third wavelength spectrum and at least one third photoelectric conversion material configured to absorb the incident light in at least one of the first wavelength spectrum or the second wavelength spectrum. The first wavelength spectrum, the second wavelength spectrum, and the third wavelength spectrum may be different wavelength spectra of a visible wavelength spectrum.

The image sensor may include a repeating unit pixel group, and the repeating unit pixel group may include the first wavelength separation filter, the second wavelength separation filter, and the third wavelength separation filter.

Each of the first, second, and third photoelectric conversion materials may include a p-type semiconductor, an n-type semiconductor, or a combination of a p-type semiconductor and an n-type semiconductor.

The first wavelength separation filter may include a mixture of the first colorant and the first photoelectric conversion material. The second wavelength separation filter may include a mixture of the second colorant and the second photoelectric conversion material. The third wavelength separation filter may include a mixture of the third colorant and the third photoelectric conversion material.

The first wavelength separation filter may include a first layer including the first colorant, and a second layer including the first photoelectric conversion material. The second wavelength separation filter may include a third layer including the second colorant, and a fourth layer including the second photoelectric conversion material. The third wavelength separation filter may include a fifth layer including the third colorant, and a sixth layer including the third photoelectric conversion material.

The image sensor may further include a light-transmitting electrode that is between the first layer and the second layer, between the third layer and the fourth layer, and between the fifth layer and the sixth layer.

The first wavelength separation filter may be configured to photoelectrically convert the incident light in both a green wavelength spectrum and a red wavelength spectrum, the first photodiode may be configured to photoelectrically convert light in a blue wavelength spectrum, the second wavelength separation filter may be configured to photoelectrically convert the incident light in both the blue wavelength spectrum and the red wavelength spectrum, the second photodiode may be configured to photoelectrically convert light in the green wavelength spectrum, the third wavelength separation filter may be configured to photoelectrically convert the incident light in both the blue wavelength spectrum and the green wavelength spectrum, and the third photodiode may be configured to photoelectrically convert light in the red wavelength spectrum.

The first wavelength separation filter may be configured to photoelectrically convert the incident light in a green wavelength spectrum, the first photodiode may be configured to photoelectrically convert the incident light in both a blue wavelength spectrum and a red wavelength spectrum, the second wavelength separation filter may be configured to photoelectrically convert the incident light in the red wavelength spectrum, the second photodiode is configured to photoelectrically convert the incident light in both the green wavelength spectrum and the blue wavelength spectrum, the third wavelength separation filter may be configured to photoelectrically convert the incident light in the blue wavelength spectrum, and the third photodiode is configured to photoelectrically convert the incident light in both the red wavelength spectrum and the green wavelength spectrum.

The first wavelength separation filter may be configured to photoelectrically convert the incident light in a red wavelength spectrum, the first photodiode may be configured to photoelectrically convert the incident light in a combination of a blue wavelength spectrum and a green wavelength spectrum, the second wavelength separation filter may be configured to photoelectrically convert the incident light in the blue wavelength spectrum, the second photodiode may be configured to photoelectrically convert the incident light in a combination of the green wavelength spectrum and the red wavelength spectrum, the third wavelength separation filter may be configured to photoelectrically convert the incident light in the green wavelength spectrum, and the third photodiode may be configured to photoelectrically convert the incident light in a combination of the blue wavelength spectrum and the red wavelength spectrum.

An electronic device may include the image sensor according to some example embodiments.

According to some example embodiments, an image sensor may include a substrate and a plurality of wavelength separation filters on the substrate. The plurality of wavelength separation filters may include a first wavelength separation filter configured to selectively transmit incident light in a first wavelength spectrum, and photoelectrically convert the incident light in at least one of a second wavelength spectrum or a third wavelength spectrum. The plurality of wavelength separation filters may include a second wavelength separation filter configured to selectively transmit the incident light in the second wavelength spectrum, and photoelectrically convert the incident light in at least one of the first wavelength spectrum or the third wavelength spectrum.

The plurality of wavelength separation filters may further include a third wavelength separation filter configured to selectively transmit the incident light in the third wavelength spectrum, and photoelectrically convert the incident light in at least one of the first wavelength spectrum or the second wavelength spectrum.

The first wavelength spectrum and the second wavelength spectrum may be within a visible wavelength spectrum.

At least one of the first wavelength spectrum or the second wavelength spectrum may be at least partially within a non-visible wavelength spectrum.

The image sensor may further include a photodiode within in the substrate, a first signal processor electrically connected to the photodiode, and a second signal processor electrically connected to at least one wavelength separation filter of the plurality of wavelength separation filters. The photodiode may at least partially overlap the at least one wavelength separation filter in a vertical direction that extends perpendicular to an upper surface of the substrate.

The photodiode may at least partially overlaps both the first wavelength separation filter and the second wavelength separation filter.

The second wavelength separation filter may at least partially overlap the first wavelength separation filter in a vertical direction that extends perpendicular to an upper surface of the substrate.

The light efficiency of the image sensor may be increased and optical crosstalk may be improved.

DETAILED DESCRIPTION

Figure 1:
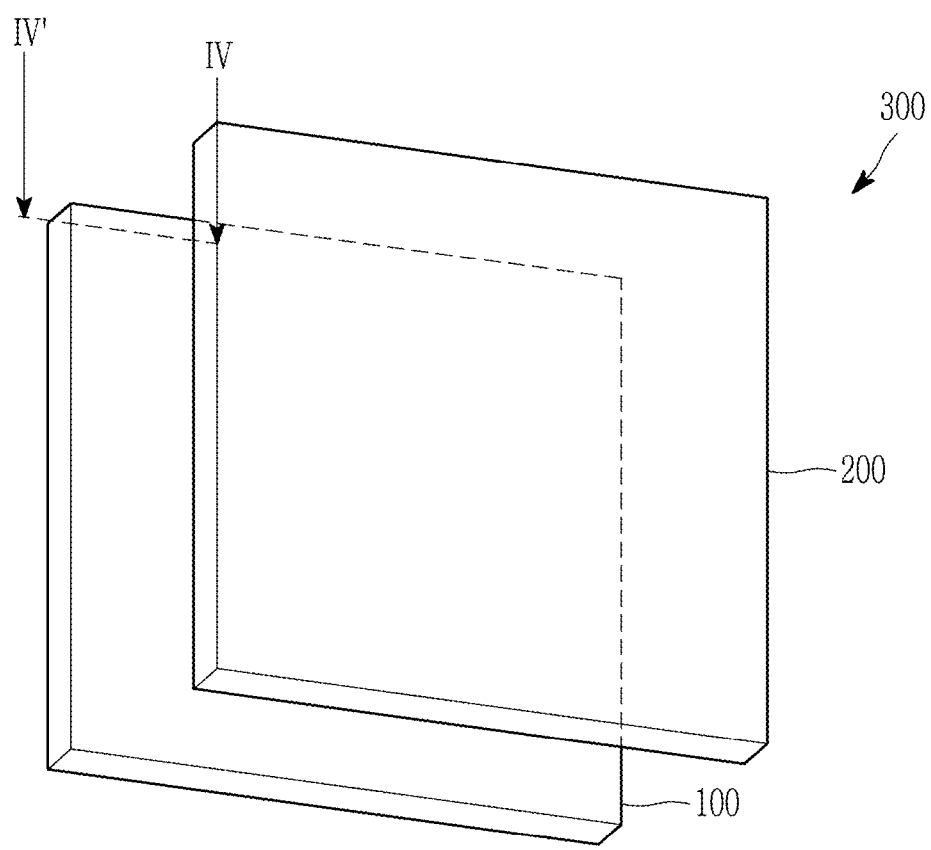
FIG. 1 is a plan view showing an example of an image sensor according to some example embodiments.

Hereinafter, some example embodiments will be described in detail so that those of ordinary skill in the art can easily implement them. However, the structure that is actually applied may be implemented in various different forms and is not limited to the example embodiments described herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity, and the same or similar constituent elements are indicated by the same reference numeral throughout the specification.

Hereinafter, the terms "lower portion" and "upper portion" are for convenience of description and do not limit the positional relationship.

Hereinafter, the upper portion of the image sensor is described as a light-receiving side, but this is for convenience of description and does not limit the positional relationship.

Hereinafter, "combination" includes a mixture and a stacked structure of two or more.

As described herein, an element that is "on" another element may be above or beneath or adjacent (e.g., horizontally adjacent) to the other element. An element that is on another element may be directly on the other element, such that the element is in direct contact with the other element. An element that is on another element may be indirectly on the other element, such that the element is isolated from direct contact with the other element by one or more interposing spaces and/or structures.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, an example of an image sensor according to some example embodiments is described.

Figure 2:
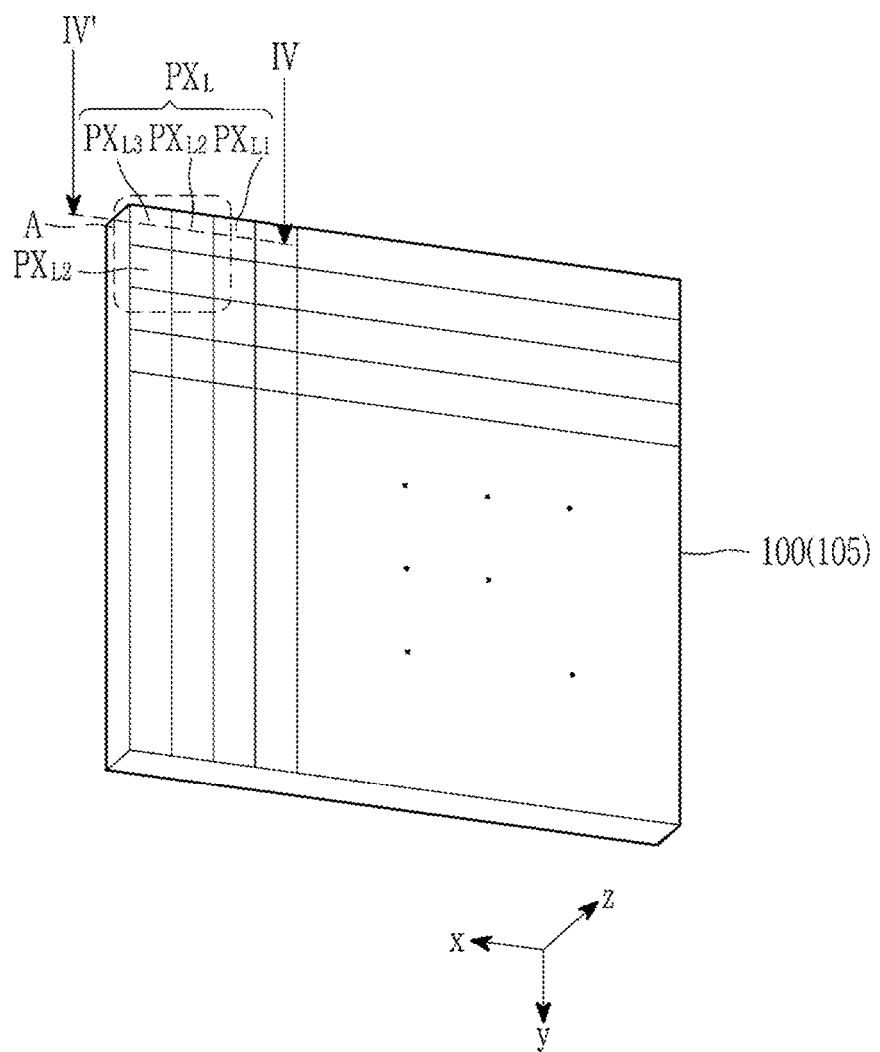
FIG. 2 is a plan view showing an example of a lower sensor of the image sensor of FIG. 1 according to some example embodiments.
Figure 3:
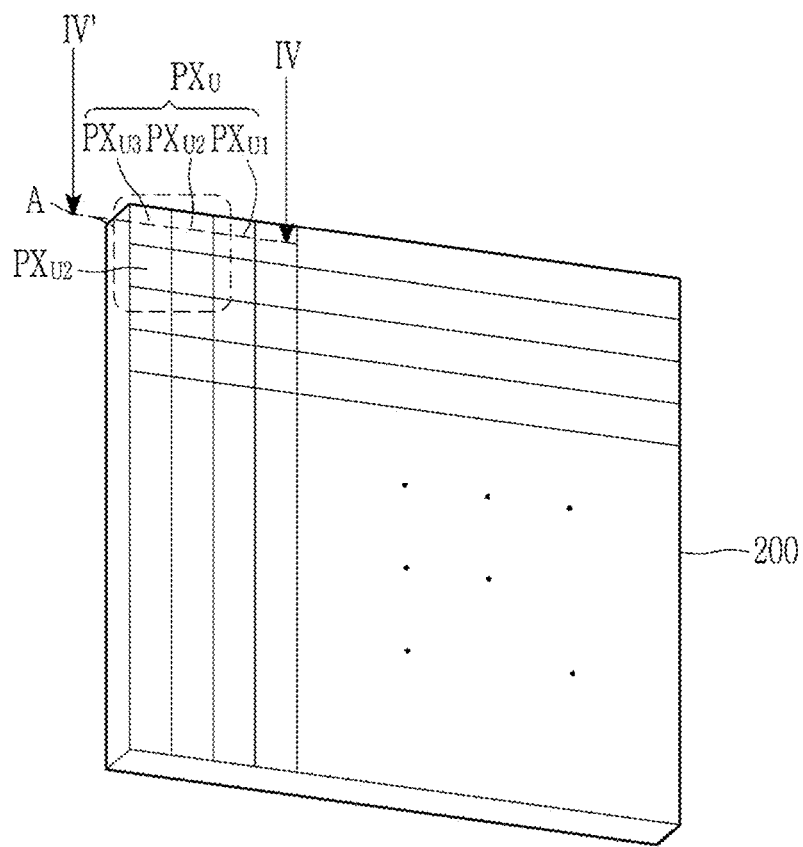
FIG. 3 is a plan view showing an example of an upper sensor of the image sensor of FIG. 1 according to some example embodiments.
Figure 4:
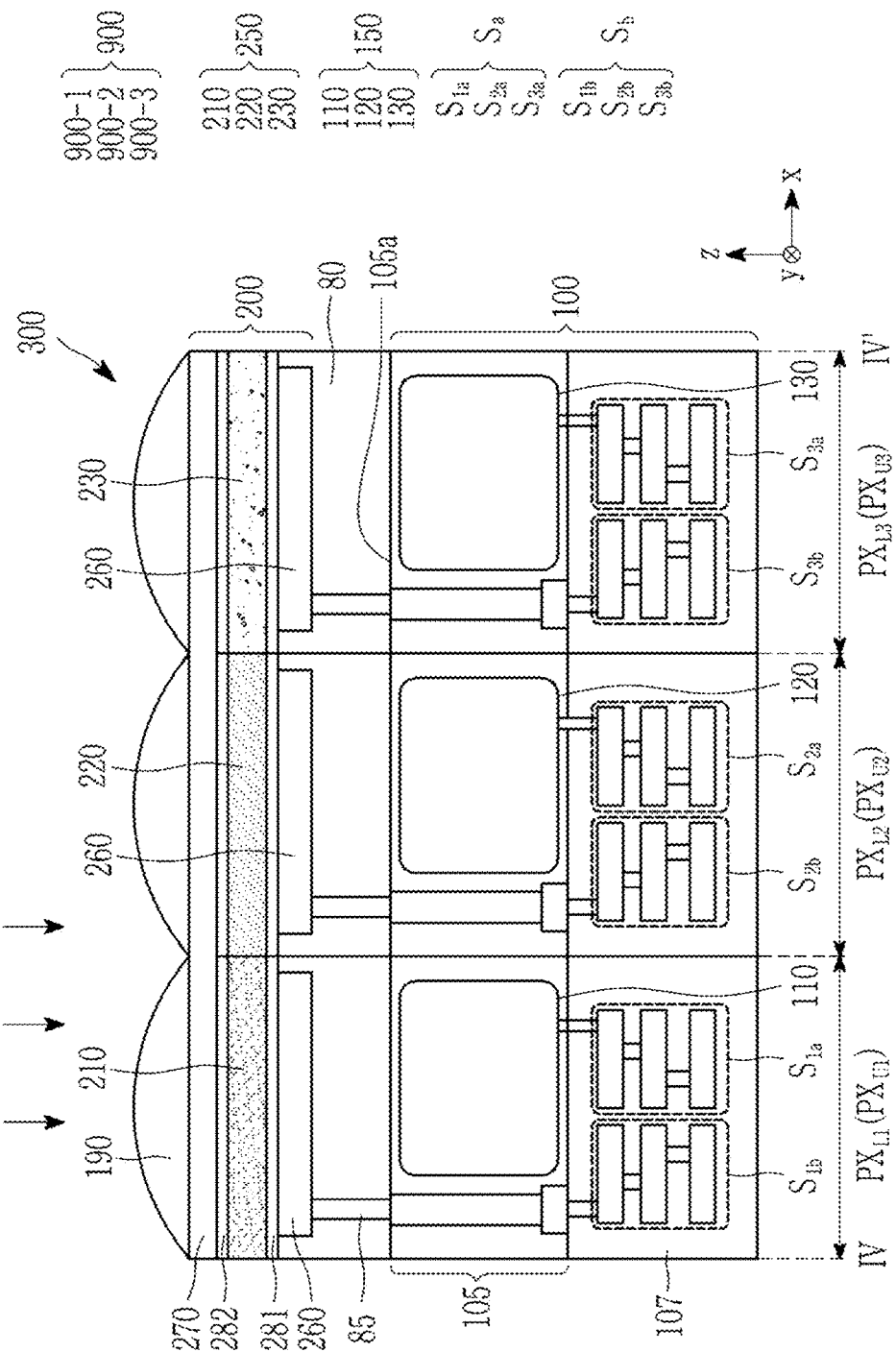
FIG. 4 is a cross-sectional view along cross-sectional view line IV-IV' of FIG. 1, illustrating an example of first, second, and third pixels of the image sensor of FIG. 1 according to some example embodiments.

FIG. 1 is a plan view showing an example of an image sensor according to some example embodiments, FIG. 2 is a plan view showing an example of a lower sensor of the image sensor of FIG. 1 according to some example embodiments, FIG. 3 is a plan view showing an example of an upper sensor of the image sensor of FIG. 1 according to some example embodiments, and FIG. 4 is a cross-sectional view along cross-sectional view line IV-IV' of FIG. 1, illustrating an example of first, second, and third pixels of the image sensor of FIG. 1 according to some example embodiments.

The image sensor 300 according to some example embodiments includes a plurality of image pixels configured to photoelectrically convert incident light of first, second, and third wavelength spectra belonging to a visible wavelength spectrum, and the plurality of image pixels may be combined to obtain (e.g., generate) a particular (or, alternatively, predetermined) image. The image sensor 300 may thus be understood to be configured to obtain the image based on combining image signals obtained based on photoelectric conversion of incident light of (e.g., incident light in) first, second, and third wavelength spectra belonging to the visible wavelength spectrum. The first wavelength spectrum, the second wavelength spectrum, and the third wavelength spectrum may be different from each other. For example, the image sensor 300 according to some example embodiments includes a first image pixel and a second image pixel on the same optical path, and an image may be obtained by complementary photoelectric conversion of the light in different wavelength spectra in the first image pixel and the second image pixel.

Referring to FIG. 1, an image sensor 300 according to some example embodiments includes a lower sensor 100 and an upper sensor 200. The upper sensor 200 may be disposed closer to the side where light is incident than the lower sensor 100, and thus, incident light may be configured to pass through the upper sensor 200 and flow into the lower sensor 100. The lower sensor 100 and the upper sensor 200 are stacked along an incident direction of light (e.g., the −Z direction as shown in at least FIGS. 1-4, extending in a direction from the upper sensor towards the lower sensor 100).

In some example embodiments, the image sensor 300 may omit one of the upper sensor 200 or the lower sensor 100. Accordingly, in some example embodiments, the image sensor 300 may include the lower sensor 100 and not include the upper sensor 200. In some example embodiments, the image sensor 300 may include the upper sensor 200 and not include the lower sensor 100.

Referring to FIG. 2, the lower sensor 100 may include a semiconductor substrate 105 (also referred to herein as a "substrate") such as a silicon wafer, and a plurality of pixels $PX_L$ arranged along an in-plane direction (e.g., xy direction) of the semiconductor substrate 105. The in-plane direction (e.g., X direction and/or Y direction) will be understood to extend in parallel with an upper surface 105a of the semiconductor substrate 105. For example, the plurality of pixels $PX_L$ may be arranged along rows and columns in the in-plane direction of the semiconductor substrate 105. Each pixel $PX_L$ may include a photodiode of a photodiode array 150, and each photodiode of the photodiode array 150 may be configured to absorb incident light in one or two of the first, second, and/or third wavelength spectra belonging to the visible wavelength spectrum and photoelectrically convert them. Herein, the first, second, and third wavelength spectra may be different wavelength spectra belonging to the visible wavelength spectrum, and may be one of a blue wavelength spectrum, a green wavelength spectrum, or a red wavelength spectrum. For example, the blue wavelength spectrum may be greater than or equal to about 380 nm and less than about 500 nm, the green wavelength spectrum may be about 500 nm to about 600 nm, and the red wavelength spectrum may be greater than about 600 nm and less than or equal to 700 nm. A combination of the first, second, and third wavelength spectra may be a wavelength spectrum of the entire visible light spectrum. For example, the first wavelength spectrum may be a blue wavelength spectrum, the second wavelength spectrum may be a green wavelength spectrum, and the third wavelength spectrum may be a red wavelength spectrum.

For example, the plurality of pixels $PX_L$ may include a first pixel $PX_{L1}$ for photoelectric conversion of light in a first wavelength spectrum, a second pixel $PX_{L2}$ for photoelectric conversion of light in a second wavelength spectrum, and a third pixels $PX_{L3}$ for photoelectric conversion of light in a third wavelength spectrum may be alternately arranged. For example, at least two of the first pixel $PX_{L1}$, the second pixel $PX_{L2}$, and the third pixel $PX_{L3}$ may be alternately arranged along a row direction (e.g., x direction) of the semiconductor substrate 105, and at least two of the first pixel $PX_{L1}$, the second pixel $PX_{L2}$, and the third pixel $PX_{L3}$ may be alternately arranged along a column direction (e.g., y direction).

For example, the plurality of pixels $PX_L$ may include a first pixel $PX_{L1}$ for photoelectric conversion of light in a first wavelength spectrum, a second pixel $PX_{L2}$ for photoelectric conversion of light in a second wavelength spectrum, and a third pixel $PX_{L3}$ for photoelectric conversion of light in a third wavelength spectrum may be alternately arranged. For example, at least two of the first pixel $PX_{L1}$, the second pixel $PX_{L2}$, and the third pixel $PX_{L3}$ may be alternately arranged along a row direction of the semiconductor substrate 105 and at least two of the first pixel $PX_{L1}$, the second pixel $PX_{L2}$, and the third pixel $PX_{L3}$ may be alternately arranged along a column direction of the semiconductor substrate 105.

For example, in the plurality of pixels $PX_L$, the first pixel $PX_{L1}$ may be configured to photoelectrically convert light in a combination of a first wavelength spectrum and a third wavelength spectrum, a second pixel $PX_{L2}$ may be configured to photoelectrically convert light in a combination of a first wavelength spectrum and a second wavelength spectrum and a third pixel $PX_{L3}$ may be configured to photoelectrically convert light of a combination of the second wavelength spectrum and the third wavelength spectrum, and the first pixel $PX_{L1}$, the second pixel $PX_{L2}$, and the third pixel $PX_{L3}$ may be alternately arranged. For example, at least two of the first pixel $PX_{L1}$, the second pixel $PX_{L2}$, and the third pixel $PX_{L3}$ may be alternately arranged along a row direction of the semiconductor substrate 105, and at least two of the first pixel $PX_{L1}$, the second pixel $PX_{L2}$, and the third pixel $PX_{L3}$ may be alternately arranged along a column direction of the semiconductor substrate 105.

The plurality of pixels $PX_L$ may include a repeating unit pixel group A, and the unit pixel group (e.g., the repeating unit pixel group) may include at least one first pixel $PX_{L1}$, at least one second pixel $PX_{L2}$, and at least one third pixel $PX_{L3}$ and thus may include at least one first wavelength separation filter 210, at least one second wavelength separation filter 220, and at least one third wavelength separation filter 230 as described herein. FIG. 2 illustrates a 2×2 matrix arrangement including one first pixel $PX_{L1}$, two second pixels $PX_{L2}$, and one third pixel $PX_{L3}$, but is not limited thereto.

Referring to FIG. 3, the upper sensor 200 includes a plurality of pixels $PX_U$ arranged along an in-plane direction (e.g., xy direction). The plurality of pixels $PX_U$ include a plurality of first, second, and third pixels $PX_{U1}$, $PX_{U2}$, and $PX_{U3}$ corresponding to the plurality of first, second, and third pixels $PX_{L1}$, $PX_{L2}$, and $PX_{L3}$ of the lower sensor 100, respectively. That is, the first pixel $PX_{U1}$ of the upper sensor 200 may be overlapped with the first pixel $PX_{L1}$ of the lower sensor 100, the second pixel $PX_{U2}$ of the upper sensor 200 may be overlapped with the second pixel $PX_{L2}$ of the lower sensor 100, and the third pixel $PX_{U3}$ of the upper sensor 200 may be overlapped with the third pixel $PX_{L3}$ of the lower sensor 100.

Referring to FIG. 4, the upper sensor 200 includes a wavelength separation filter array 250 arranged along an in-plane direction (e.g., xy direction) of the semiconductor substrate 105. The wavelength separation filter array 250 may be referred to herein as a plurality of wavelength separation filters 210, 220, 230 that are on (e.g., directly or indirectly on in the Z direction) the semiconductor substrate 105 and arranged alone an in-plane direction (e.g., X direction and/or Y direction) of the semiconductor substrate 105.

The wavelength separation filter array 250 may be configured to separate light according to a wavelength spectrum to transmit light in some wavelength spectrum and photoelectrically convert light in some wavelength spectrum, and may include a plurality of wavelength separation filters 210, 220, and 230 configured to separate light of different wavelength spectrums ("spectra"). The plurality of wavelength separation filters 210, 220, and 230 may be alternately arranged along rows and columns in an in-plane direction of the upper sensor 200. That is, the plurality of pixels $PX_U$ may include one of the plurality of wavelength separation filters 210, 220, or 230.

For example, the wavelength separation filter array 250 may include a first wavelength separation filter 210, a second wavelength separation filter 220, and a third wavelength separation filter 230 which are disposed in the first, second, and third pixels $PX_{U1}$, $PX_{U2}$, and $PX_{U3}$, respectively.

The first wavelength separation filter 210 may be configured to transmit light in the first wavelength spectrum and photoelectrically convert at least one of the second wavelength spectrum or the third wavelength spectrum, the second wavelength separation filter 220 may be configured to transmit light in the second wavelength spectrum and photoelectrically convert at least one of the first wavelength spectrum or the third wavelength spectrum, and the third wavelength separation filter 230 may be configured to transmit light in a third wavelength spectrum and photoelectrically convert at least one of the first wavelength spectrum or the second wavelength spectrum.

The incident light transmitted through (e.g., selectively transmitted by) the first wavelength separation filter 210 may be introduced into the first photodiode 110 in the first pixel $PX_{L1}$ of the lower sensor 100 to be photoelectrically converted separately from the upper sensor 200, the incident light transmitted through (e.g., selectively transmitted by) the second wavelength separation filter 220 may be introduced into the second photodiode 120 in the second pixel $PX_{L2}$ of the lower sensor 100 to be photoelectrically converted separately from the upper sensor 200, and the incident light transmitted through (e.g., selectively transmitted by) the third wavelength separation filter 230 may be introduced into the third photodiode 130 in the third pixel $PX_{L3}$ of the lower sensor 100 to be photoelectrically converted separately from the upper sensor 200.

Restated, where the image sensor 300 is configured to receive incident light 900 that includes incident light in a first wavelength spectrum 900-1, incident light in a second wavelength spectrum 900-2, and incident light in a third wavelength spectrum 900-3, the first wavelength separation filter 210 may be configured to selectively transmit the incident light in the first wavelength spectrum 900-1 and photoelectrically convert the incident light in at least one of the second wavelength spectrum −2 or the third wavelength spectrum (e.g., at least one of 900-2 or 900-3), the second wavelength separation filter 220 may be configured to selectively transmit the incident light in the second wavelength spectrum 900-2 and photoelectrically convert the incident light in at least one of the first wavelength spectrum or the third wavelength spectrum (e.g., at least one of 900-1 or 900-3), and the third wavelength separation filter 230 may be configured to selectively transmit the incident light in the third wavelength spectrum 900-3 and photoelectrically convert the incident light in at least one of the first wavelength spectrum or the second wavelength spectrum (e.g., at least one of 900-1 or 900-2).

The incident light photoelectrically converted by a given wavelength separation filter may be at least partially inhibited from being transmitted by the given wavelength separation filter (e.g., may be partially or completely absorbed). For example, where the first wavelength separation filter 210 is configured to selectively transmit the incident light in the first wavelength spectrum 900-1 and photoelectrically convert the incident light in a combination of the second wavelength spectrum −2 or the third wavelength spectrum (e.g., a combination of 900-2 or 900-3), the first wavelength separation filter 210 may be configured to partially or completely absorb the incident light 900 in the second and third wavelength spectra (e.g., 900-2 and 900-3) and thus partially or completely preventing said incident light 900 in the second and third wavelength spectra from passing through the first wavelength separation filter 210 to reach the first photodiode 110, while selectively transmitting the incident light 900 in the first wavelength spectrum (e.g., 900-1) so that said incident light in the first wavelength spectrum does pass through the first wavelength separation filter 210 to reach the first photodiode 110.

For example, the first wavelength separation filter 210 may be configured to selectively transmit incident light in a first wavelength spectrum and photoelectrically convert incident light in a combination of a second wavelength spectrum and a third wavelength spectrum. For example, the second wavelength separation filter 220 may be configured to selectively transmit incident light in the second wavelength spectrum and photoelectrically convert incident light in the first wavelength spectrum and the third wavelength spectrum. For example, the third wavelength separation filter 230 may be configured to selectively transmit incident light in a third wavelength spectrum and photoelectrically convert incident light in the first wavelength spectrum and the second wavelength spectrum. For example, the first wavelength spectrum may be a blue wavelength spectrum, the second wavelength spectrum may be a green wavelength spectrum, and the third wavelength spectrum may be a red wavelength spectrum.

In the case of the first pixels $PX_{L1}$ and $PX_{U1}$, the first wavelength separation filter 210 of the upper sensor 200 may be configured to photoelectrically convert incident light in a combination of a green wavelength spectrum and a red wavelength spectrum, and the first photodiode 110 of the lower sensor 100 may be configured to absorb incident light in a blue wavelength spectrum and perform photoelectric conversion.

In the case of the second pixels $PX_{L2}$ and $PX_{U2}$, the second wavelength separation filter 220 of the upper sensor 200 may be configured to photoelectrically convert incident light in a combination of a blue wavelength spectrum and a red wavelength spectrum, and the second photodiode 120 of the lower sensor 100 may be configured to absorb incident light in a green wavelength spectrum and perform photoelectric conversion.

In the case of the third pixels $PX_{L3}$ and $PX_{U3}$, the third wavelength separation filter 230 of the upper sensor 200 may be configured to photoelectrically convert incident light in a combination of a blue wavelength spectrum and a green wavelength spectrum and the third photodiode 130 of the lower sensor 100 may be configured to absorb incident light in a red wavelength spectrum and perform photoelectric conversion.

As another example, for example, the first wavelength separation filter 210 may be configured to selectively transmit light of a combination of (e.g., both of) the first wavelength spectrum and the third wavelength spectrum and photoelectrically convert the light in the second wavelength spectrum. For example, the second wavelength separation filter 220 may be configured to selectively transmit light of a combination of the first wavelength spectrum and the second wavelength spectrum, and photoelectrically convert the light in the third wavelength spectrum. For example, the third wavelength separation filter 230 may be configured to selectively transmit light of a combination of the third wavelength spectrum and the second wavelength spectrum and photoelectrically convert the light in the first wavelength spectrum. The first, second, and third wavelength spectra may each be a different one of a blue wavelength spectrum, a green wavelength spectrum, or a red wavelength spectrum. For example, the first wavelength spectrum may be a blue wavelength spectrum, the second wavelength spectrum may be a green wavelength spectrum, and the third wavelength spectrum may be a red wavelength spectrum.

In the case of the first pixels $PX_{L1}$ and $PX_{U1}$, the first wavelength separation filter 210 of the upper sensor 200 may be configured to photoelectrically convert light in the green wavelength spectrum, and the first photodiode 110 of the lower sensor 100 may be configured to absorb incident light in a combination of a blue wavelength spectrum and a red wavelength spectrum and perform photoelectric conversion.

In the case of the second pixels $PX_{L2}$, and $PX_{U2}$, the second wavelength separation filter 220 of the upper sensor 200 may be configured to photoelectrically convert light in the red wavelength spectrum and the second photodiode 120 of the lower sensor 100 may be configured to absorb incident light in a combination of a green wavelength spectrum and a blue wavelength spectrum and perform photoelectric conversion.

In the case of the third pixels $PX_{L3}$ and $PX_{U3}$, the third wavelength separation filter 230 of the upper sensor 200 may be configured to photoelectrically convert light in the blue wavelength spectrum and the third photodiode 130 of the lower sensor 100 may be configured to absorb incident light in a combination of a red wavelength spectrum and a green wavelength spectrum and perform photoelectric conversion.

As another example, for example, the first wavelength separation filter 210 may be configured to selectively transmit light in a combination of a first wavelength spectrum and a second wavelength spectrum, and photoelectrically convert light in a third wavelength spectrum. For example, the second wavelength separation filter 220 may be configured to selectively transmit light of a combination of the second wavelength spectrum and the third wavelength spectrum and photoelectrically convert the light in the first wavelength spectrum. For example, the third wavelength separation filter 230 may be configured to selectively transmit light of a combination of the third wavelength spectrum and the first wavelength spectrum and photoelectrically convert the light in the second wavelength spectrum. For example, the first wavelength spectrum may be a blue wavelength spectrum, the second wavelength spectrum may be a green wavelength spectrum, and the third wavelength spectrum may be a red wavelength spectrum.

In the case of the first pixels $PX_{L1}$ and $PX_{U1}$, the first wavelength separation filter 210 of the upper sensor 200 may be configured to photoelectrically convert light (e.g., incident light) in the red wavelength spectrum, and the first photodiode 110 of the lower sensor 100 may be configured to absorb incident light in a combination of a blue wavelength spectrum and a green wavelength spectrum to photoelectrically convert the absorbed light.

In the case of the second pixels $PX_{L2}$ and $PX_{U2}$, the second wavelength separation filter 220 of the upper sensor 200 may be configured to photoelectrically convert light (e.g., incident light) in the blue wavelength spectrum, and the second photodiode 120 of the lower sensor 100 may be configured to absorb incident light in a combination of a green wavelength spectrum and a red wavelength spectrum to photoelectrically convert the absorbed light.

In the case of the third pixels $PX_{L3}$ and $PX_{U3}$, the third wavelength separation filter 230 of the upper sensor 200 may be configured to photoelectrically convert the light (e.g., incident light) in the green wavelength spectrum, and the third photodiode 130 of the lower sensor 100 may be configured to absorb incident light in a combination of the blue wavelength spectrum and the red wavelength spectrum to photoelectrically convert the absorbed light.

In some example embodiments, the first wavelength separation filter 210 of the upper sensor 200 may be configured to photoelectrically convert light (e.g., incident light) in both the green wavelength spectrum and the red wavelength spectrum, and the first photodiode 110 of the lower sensor 100 may be configured to absorb incident light in the blue wavelength spectrum to photoelectrically convert the absorbed light.

In some example embodiments, the second wavelength separation filter 220 of the upper sensor 200 may be configured to photoelectrically convert incident light in both the blue wavelength spectrum and the red wavelength spectrum, and the second photodiode 120 of the lower sensor 100 may be configured to absorb incident light in the green wavelength spectrum to photoelectrically convert the absorbed light.

In some example embodiments, the third wavelength separation filter 230 of the upper sensor 200 may be configured to photoelectrically convert incident light in both the blue wavelength spectrum and the green wavelength spectrum, and the third photodiode 130 of the lower sensor 100 may be configured to absorb incident light in the red wavelength spectrum to photoelectrically convert the absorbed light.

In some example embodiments, the first wavelength separation filter 210 of the upper sensor 200 may be configured to photoelectrically convert light (e.g., incident light) in the green wavelength spectrum, and the first photodiode 110 of the lower sensor 100 may be configured to absorb incident light in both the blue wavelength spectrum and the red wavelength spectrum to photoelectrically convert the absorbed light.

In some example embodiments, the second wavelength separation filter 220 of the upper sensor 200 may be configured to photoelectrically convert incident light in the red wavelength spectrum, and the second photodiode 120 of the lower sensor 100 may be configured to absorb incident light in both the blue wavelength spectrum and the green wavelength spectrum to photoelectrically convert the absorbed light.

In some example embodiments, the third wavelength separation filter 230 of the upper sensor 200 may be configured to photoelectrically convert incident light in the blue wavelength spectrum, and the third photodiode 130 of the lower sensor 100 may be configured to absorb incident light in both the red wavelength spectrum and the green wavelength spectrum to photoelectrically convert the absorbed light.

Accordingly, incident light through the first pixels $PX_{L1}$ and $PX_{U1}$ stacked each other in the image sensor 300 is configured to photoelectrically converted in the first wavelength separation filter 210 of the upper sensor 200 to obtain first image signals and also photoelectrically converted in the first photodiode 110 of the lower sensor 100 to obtain second image signals, and the first image signals and the second image signals are combined to obtain a particular (or, alternatively, predetermined) image. Restated, the first and second signal processors $S_{1a}$ and $S_{1b}$ may be configured to generate separate, respective image signals that are configured to be combined to generate an image that is considered to be an image generated by the image sensor 300. Accordingly, the incident light through the first pixels $PX_{L1}$ and $PX_{U1}$, wherein visible light in the full wavelength spectra including first, second, and third wavelength spectra is photoelectrically converted, may increase light efficiency without a light loss.

Likewise, incident light through second pixels $PX_{L2}$ and $PX_{U2}$ stacked each other in the image sensor 300 is photoelectrically converted in the second wavelength separation filter 220 of the upper sensor 200 to obtain first image signals and also photoelectrically converted in the second photodiode 120 of the lower sensor 100 to obtain second image signals, and the first image signals and the second image signals may be combined to obtain a particular (or, alternatively, predetermined) image. Restated, the first and second signal processors $S_{2a}$ and $S_{2b}$ may be configured to generate separate, respective image signals that are configured to be combined to generate an image that is considered to be an image generated by the image sensor 300. Accordingly, the incident light through the second pixels $PX_{L2}$ and PX$_{U2}$, wherein visible light in the full wavelength spectra including the first, second, and third wavelength spectra is photoelectrically converted, may increase light efficiency without a light loss.

Likewise, incident light through the third pixels PX$_{L3}$ and PX$_{U3}$ stacked each other in the image sensor 300 is photoelectrically converted in the third wavelength separation filter 230 of the upper sensor 200 to obtain first image signals and also photoelectrically converted in the third photodiode 130 of the lower sensor 100 to obtain second image signals, and the first image signals and the second image signals are combined to obtain a particular (or, alternatively, predetermined) image. Restated, the first and second signal processors S$_{1a}$ and S$_{1b}$ may be configured to generate separate, respective image signals that are configured to be combined to generate an image that is considered to be an image generated by the image sensor 300. Accordingly, the incident light through the third pixels PX$_{L3}$ and PX$_{U3}$, wherein visible light in the full wavelength spectra including the first, second, and third wavelength spectra is photoelectrically converted, may increase light efficiency without a light loss.

The first wavelength separation filter 210, the second wavelength separation filter 220, and the third wavelength separation filter 230 may include a photoelectric conversion material for photoelectric conversion characteristics of light of a particular (or, alternatively, predetermined) wavelength spectrum (e.g., the photoelectric conversion material of a given wavelength separation filter may be configured to enable photoelectric conversion of incident light in the one or more wavelength spectra that the given wavelength separation filter is configured to photoelectrically convert). It will be understood that the first wavelength separation filter 210, the second wavelength separation filter 220, and/or the third wavelength separation filter 230 may include a same photoelectric conversion material, different photoelectric conversion materials, or any combination thereof. A given wavelength separation filter may include multiple photoelectric conversion materials, and different wavelengths separation filters may include different combinations of photoelectric conversion materials, where said different combinations may include one or more same and/or different photoelectric conversion materials. Accordingly, it will be understood that each of the first wavelength separation filter 210, the second wavelength separation filter 220, and the third wavelength separation filter 230 may include one or more photoelectric conversion materials. The photoelectric conversion material may be a material configured to generate electric charge by receiving light, and may be, for example, a p-type semiconductor, an n-type semiconductor, or a combination of a p-type semiconductor and an n-type semiconductor.

The first wavelength separation filter 210 may include at least one first photoelectric conversion material configured to absorb the incident light 900 in at least one of the second wavelength spectrum or the third wavelength spectrum (e.g., at least one of 900-2 or 900-3) and photoelectrically convert the absorbed incident light. The first photoelectric conversion material may include, for example, a material configured to selectively absorb the incident light of (e.g., incident light in) a second wavelength spectrum (e.g., 900-2), a material configured to selectively absorb the incident light of a third wavelength spectrum (e.g., 900-3), a material configured to simultaneously absorb the incident light of the second and third wavelength spectra (e.g., both 900-2 and 900-3), or a combination thereof, and may be one material or two or more materials. The first photoelectric conversion material may be a p-type semiconductor, an n-type semiconductor, or a combination of a p-type semiconductor and an n-type semiconductor which have such optical characteristics.

The second wavelength separation filter 220 may include at least one second photoelectric conversion material configured to absorb the incident light 900 in at least one of the first wavelength spectrum or the third wavelength spectrum (e.g., at least one of 900-1 or 900-3) to photoelectrically convert the absorbed light. The second photoelectric conversion material may include, for example, a material configured to selectively absorb the incident light of a first wavelength spectrum (e.g., 900-1), a material configured to selectively absorb the incident light of a third wavelength spectrum (e.g., 900-3), a material configured to simultaneously absorb the incident light of the first and third wavelength spectra (e.g., both of 900-1 and 900-3), or a combination thereof, and may be one material or two or more materials. The second photoelectric conversion material may be a p-type semiconductor, an n-type semiconductor, or a combination of a p-type semiconductor and an n-type semiconductor which have such optical characteristics.

The third wavelength separation filter 230 may include a third photoelectric conversion material configured to absorb the incident light 900 in at least one of the first wavelength spectrum or the second wavelength spectrum (e.g., at least one of 900-1 or 900-2) to photoelectrically convert the absorbed light. The third photoelectric conversion material may include, for example, a material configured to selectively absorb the incident light of a first wavelength spectrum (e.g., 900-1), a material configured to selectively absorb the incident light of a second wavelength spectrum (e.g., 900-2), a material configured to simultaneously absorb the incident light of the first and second wavelength spectra (e.g., both 900-1 and 900-2) or a combination of thereof, and may be one material or two or more materials. The third photoelectric conversion material may be a p-type semiconductor, an n-type semiconductor, or a combination of a p-type semiconductor and an n-type semiconductor which have such optical characteristics.

It will be understood that first photoelectric conversion material, the second photoelectric conversion material, and the third photoelectric conversion material independently include a p-type semiconductor, an n-type semiconductor, or a combination of a p-type semiconductor and an n-type semiconductor. The first photoelectric conversion material, the second photoelectric conversion material, and the third photoelectric conversion material may include one or more same materials, one or more different materials, and/or different combinations of materials.

The first wavelength separation filter 210, the second wavelength separation filter 220, or the third wavelength separation filter 230 respectively may further include at least one of a cross-linked polymer or a binder. In some example embodiments, each of the first wavelength separation filter 210, the second wavelength separation filter 220, and the third wavelength separation filter 230 may further include at least one of a cross-linked polymer or a binder.

The first wavelength separation filter 210, the second wavelength separation filter 220, or the third wavelength separation filter 230 may be for example obtained from each photosensitive composition, for example, formed by coating a photosensitive composition including each first, second, or third photoelectric conversion material, the cross-linkable monomer, the binder, a photoinitiator, and a solvent and then, treated through photolithography.

For example, the first wavelength separation filter 210, the second wavelength separation filter 220, and the third wavelength separation filter 230 respectively may further include a colorant in addition to the photoelectric conversion material. Restated, each of the first wavelength separation filter 210, the second wavelength separation filter 220, and the third wavelength separation filter 230 may further include a colorant. Some or all of first wavelength separation filter 210, the second wavelength separation filter 220, and the third wavelength separation filter 230 may include same or different colorants. The colorant may include a dye, a pigment, a coloring agent, or a combination thereof, configured to selectively transmit a portion of visible wavelength region.

The first wavelength separation filter 210 may include at least one first colorant configured to transmit (e.g., selectively transmit) light of the first wavelength spectrum (e.g., incident light in the first wavelength spectrum 900-1), and the first colorant may be one type of material or two or more types of materials. The second wavelength separation filter 220 may include at least one second colorant configured to transmit (e.g., selectively transmit) light of the second wavelength spectrum (e.g., incident light in the second wavelength spectrum 900-2), and the second colorant may be one type of material or two or more types of materials. The third wavelength separation filter 230 may include at least one third colorant configured to transmit (e.g., selectively transmit) light of a third wavelength spectrum (e.g., incident light in the third wavelength spectrum 900-3), and the third colorant may be one type of material or two or more types of materials. The first colorant, the second colorant, and the third colorant may be configured to selectively transmit light (e.g., incident light) of different wavelength spectra (e.g., different ones or combinations of 900-1, 900-2, and/or 900-3 of the incident light 900) and thus may be different materials.

For example, the aforementioned photoelectric conversion material and the aforementioned colorant may be included in a mixture. For example, the first wavelength separation filter 210 may include a first mixture of at least one first colorant configured to transmit (e.g., selectively transmit) light of the first wavelength spectrum (e.g., incident light in the first wavelength spectrum 900-1) and at least one first photoelectric conversion material configured to absorb incident light of (e.g., incident light in) at least one of the second wavelength spectrum or the third wavelength spectrum (e.g., at least one of 900-2 or 900-3), and the first mixture may optionally further include a cross-linked polymer and/or a binder. For example, the second wavelength separation filter 220 may include a second mixture of at least one second configured to transmit (e.g., selectively transmit) light of the second wavelength spectrum (e.g., incident light in the second wavelength spectrum 900-2) and at least one second photoelectric conversion material configured to absorb incident light of (e.g., incident light in) at least one of the first wavelength spectrum or the third wavelength spectrum (e.g., at least one of 900-1 or 900-3), and the second mixture may optionally further include a cross-linked polymer and/or a binder. For example, the third wavelength separation filter 230 may include a third mixture of at least one third colorant configured to transmit (e.g., selectively transmit) light of a third wavelength spectrum (e.g., incident light in the third wavelength spectrum 900-3), and at least one third photoelectric conversion material configured to absorb incident light in at least one of the first wavelength spectrum or the second wavelength spectrum (e.g., at least one of 900-1 or 900-2), and the third mixture may optionally further include a cross-linked polymer and/or a binder. In some example embodiments, the first wavelength separation filter 210 may include the first colorant and the first photoelectric conversion material as separate structures, layers, or the like that may not be considered to be a mixture of said materials. In some example embodiments, the second wavelength separation filter 220 may include the second colorant and the second photoelectric conversion material as separate structures, layers, or the like that may not be considered to be a mixture of said materials. In some example embodiments, the third wavelength separation filter 230 may include the third colorant and the third photoelectric conversion material as separate structures, layers, or the like that may not be considered to be a mixture of said materials.

The first wavelength separation filter 210, the second wavelength separation filter 220, or the third wavelength separation filter 230 may be, for example, obtained from each photosensitive composition, for example, by coating the photosensitive composition including the first, second, or third colorant, the first, second, or third photoelectric conversion material, a cross-linkable monomer, a binder, a photoinitiator, and a solvent and treating it through photolithography.

The upper sensor 200 may further include a pair of electrodes 260 and 270 respectively in the first, second, and third pixels $PX_{U1}$, $PX_{U2}$, and $PX_{U3}$. The pair of electrodes 260 and 270 may be disposed to face each other in the center of the first wavelength separation filter 210, the second wavelength separation filter 220, and the third wavelength separation filter 230. The pair of electrodes 260 and 270 may be configured to transfer electric charges (e.g., holes or electrons) generated by photoelectric conversion. At least one of the electrodes 260 and/or 270 may be configured to transfer electric charges (e.g., holes or electrodes) generated based on photoelectric conversion by one or more of the wavelength separation filters 210, 220, and/or 230 of the wavelength separation filter array 250 (e.g., the plurality of wavelengths separation filters).

One of the pair of electrodes 260 or 270 may be an anode and the other may be a cathode. One of the pair of electrodes 260 or 270 may be a pixel electrode and the other may be a common electrode. At least one of the pair of electrodes 260 or 270 may be a light-transmitting electrode. For example, the pair of electrodes 260 and 270 may be a light-transmitting electrode, respectively. The light-transmitting electrode may have a light transmittance of greater than or equal to about 80%, greater than or equal to about 85%, greater than or equal to about 90%, or greater than or equal to about 95%, and may include, for example, at least one of an oxide conductor, a carbon conductor, or a metal thin film. The oxide conductor may include at least one selected from indium tin oxide (ITO), indium zinc oxide (IZO), zinc tin oxide (ZTO), aluminum tin oxide (ATO), and aluminum zinc oxide (AZO), the carbon conductor may be at least one selected from graphene and carbon nanoparticles, and the metal thin film may be an ultrathin film including aluminum (Al), magnesium (Mg), silver (Ag), gold (Au), an alloy thereof, or a combination thereof. One of the pair of electrodes 260 or 270 may be electrically connected to the signal processors $S_{1b}$, $S_{2b}$, and $S_{3b}$.

The upper sensor 200 may further include auxiliary layers 281 and 282 disposed on the first, second, and third pixels $PX_{U1}$, $PX_{U2}$, and $PX_{U3}$, respectively. The auxiliary layers 281 and 282 may be configured to control mobility of charges (e.g., holes or electrons) generated by photoelectric conversion or may improve optical characteristics. The auxiliary layers 281 and 282 may be between, for example, the electrode 260 and the wavelength separation filter array 250 and between the electrode 270 and the wavelength separation filter array 250, and at least one of the auxiliary layers 281 or 282 may be omitted.

The lower sensor 100 may include signal processors Sa and Sb below or above the semiconductor substrate 105 (e.g., in a separate substrate 107, which may have any of the compositions described herein as compositions of the semiconductor substrate 105) or within the semiconductor substrate 105, and each signal processor Sa and Sb may include a metal wire and a pad. The metal wire and the pad may be made of a metal having a low specific resistance, such as aluminum (Al), copper (Cu), silver (Ag), and alloys thereof, in order to reduce signal delay, but is not limited thereto. For example, each pixel $PX_L$ and $PX_U$ may include at least two signal processors Sa and Sb, and may include first signal processors $S_{1a}$, $S_{2a}$, and $S_{3a}$ that are electrically connected to the first, second, or third photodiodes 110, 120, and 130 of the lower sensor 100, respectively and second signal processors $S_{1b}$, $S_{2b}$, and $S_{3b}$ that are electrically connected to the first, second, or third wavelength separation filters 210, 220, and 230 of the upper sensor 200, respectively. Each pixel $PX_L$ and $PX_U$ may obtain a particular (or, alternatively, predetermined) image by combining the image signal obtained from the first signal processors $S_{1a}$, $S_{2a}$, and $S_{3a}$ and the image signal obtained from the second signal processors $S_{1b}$, $S_{2b}$, and $S_{3b}$.

As shown in at least FIG. 4, the image sensor 300 may include one or more photodiodes (e.g., the first, second, and/or third photodiodes 110, 120, and/or 130) that is/are within the semiconductor substrate 105 (e.g., located within a volume space device by outer surfaces of the semiconductor substrate 105, including the upper surface 105a), where the one or more photodiodes at least partially overlap at least one wavelength separation filter of the wavelength separation filter array 250 (e.g., one or more of the first, second, and/or third wavelength separation filters 210, 220, and/or 230). Said overlap may be in a vertical direction (e.g., Z direction) that extends perpendicular to the upper surface 105a of the semiconductor substrate 105).

As shown in at least FIG. 4, the image sensor 300 may include, for each given photodiode (e.g., 110, 120, or 130), a first signal processor (e.g., $S_{1a}$, $S_{2a}$, or $S_{3a}$) electrically connected to the given photodiode (e.g., 110, 120, or 130) and a second signal processor (e.g., $S_{1b}$, $S_{2b}$, or $S_{1b}$) electrically connected to the at least one wavelength separation filter that is at least partially overlapped (e.g., in the vertical direction) by the given photodiode (e.g., 110, 120, or 130).

An insulation layer 80 is formed between the lower sensor 100 and the upper sensor 200. The insulation layer 80 has a through-hole 85 electrically connected to the electrode 260.

A focusing lens 190 is formed on the upper sensor 200. The focusing lens 190 may collect incident light into one point by controlling a direction of incident light. The focusing lens 190 may be, for example, a cylinder shape or a hemispherical shape, but is not limited thereto.

In this way, the image sensor 300 according to some example embodiments may obtain a particular (or, alternatively, predetermined) image by respectively photoelectrically converting light of different wavelength spectra in the pixels $PX_L$ and $PX_U$ overlapped each other to obtain a plurality of image signals and combining these image signals. Accordingly, since electrical signals are obtained by photoelectrically converting light of full visible wavelength spectra in each pixel $PX_L$ and $PX_U$ constituting the image sensor 300, light efficiency may be increased without a light loss.

In general, as for an image sensor including a blue filter, a green filter, and a red filter may exhibit low light efficiency, because a pixel including the blue filter may lose light of a green wavelength spectrum and a red wavelength spectrum except for the blue wavelength spectrum and photoelectrically convert at most ⅓ of incident light. A pixel including the green filter and a pixel including the red filter are the same as the pixel including the blue filter. In addition, since the blue filter, the green filter, and the red filter in general do not completely filter light of the other wavelength spectra except for the corresponding wavelength spectrum, a portion of the other wavelength spectra except for the corresponding wavelength spectrum may flow into a photodiode and thus generate crosstalks due to incomplete wavelength-separating characteristics (e.g., mixed color).

In some example embodiments, as described above, wavelength separation filter array 250 that is simultaneously capable of realizing wavelength selectivity and wavelength separation is included to increase light efficiency of the image sensor 300 and reduce the crosstalks. Accordingly, a high efficiency and high sensitivity image sensor may be realized.

Another example of an image sensor according to some example embodiments is described below.

Figure 5:
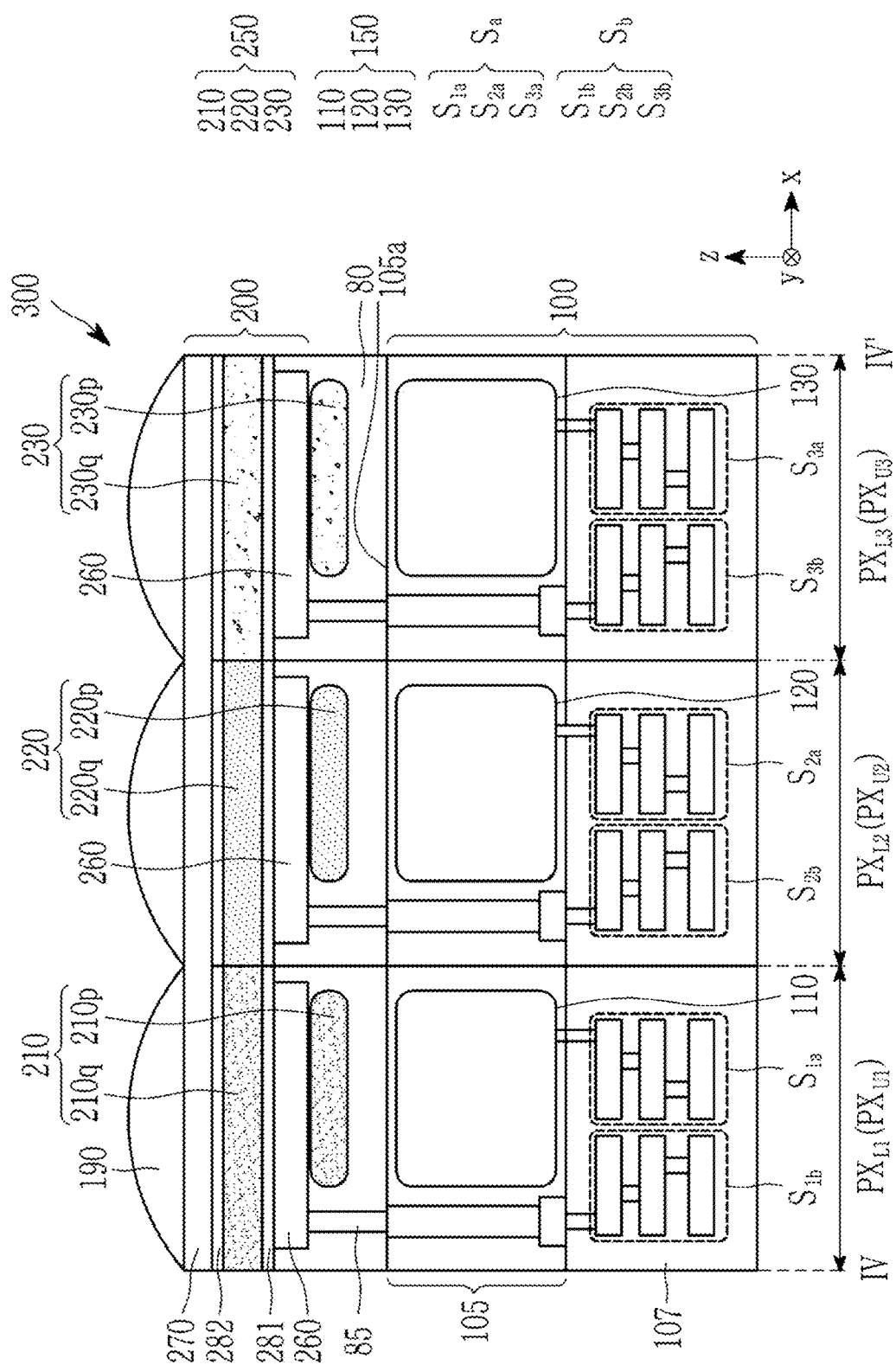
FIG. 5 is a cross-sectional view along cross-sectional view line IV-IV' of FIG. 1, illustrating another example of first, second, and third pixels of the image sensor of FIG. 1 according to some example embodiments.

FIG. 5 is a cross-sectional view along cross-sectional view line IV-IV' of FIG. 1, illustrating another example of first, second, and third pixels of the image sensor of FIG. 1.

The image sensor 300 according to some example embodiments, like some example embodiments, including the example embodiments shown in FIG. 4, includes a lower sensor 100 and an upper sensor 200 stacked each other, and the lower sensor 100 is the same as described above. The upper sensor 200, as described above, includes a wavelength separation filter array 250, and the wavelength separation filter array 250 includes a first wavelength separation filter 210, a second wavelength separation filter 220, and a third wavelength separation filter 230 in the first, second, and third pixels $PX_{U1}$, $PX_{U2}$, and $PX_{U3}$.

However, the image sensor 300 according to some example embodiments, unlike some example embodiments, including the example embodiments shown in FIG. 4 includes a first wavelength separation filter 210, a second wavelength separation filter 220, and a third wavelength separation filter 230 which include a plurality of layers.

Specifically, the first wavelength separation filter 210 may include a first layer 210p configured to transmit (e.g., selectively transmit) light (e.g., incident light) of the first wavelength spectrum (e.g., the incident light in the first wavelength spectrum 900-1) and a second layer 210q configured to photoelectrically convert light (e.g., incident light) of at least one of the second or third wavelength spectra (e.g., at least one of 900-2 or 900-3). The first layer 210p may include the aforementioned first colorant configured to transmit light of the first wavelength spectrum (e.g., the incident light in the first wavelength spectrum 900-1), and the first colorant may be one type of material (e.g., one type of colorant) or two or more types of material (e.g., two or more types of colorant). The second layer 210q may include the aforementioned first photoelectric conversion material configured to absorb incident light of at least one of the second or third wavelength spectra (e.g., at least one of 900-2 or 900-3) and photoelectrically convert the absorbed light, and the first photoelectric conversion material may be one type of material or two or more types of material. The first layer 210p and the second layer 210q independently may further include at least one of a cross-linked polymer or a binder. Herein, the second layer 210q is illustrated to be disposed on the first layer 210p but not limited thereto, and the first layer 210p may be disposed on the second layer 210q. As shown in FIG. 5, in some example embodiments the first and second layers 210p and 210q may be isolated from direct contact with each other, for example by at least an electrode 260.

Likewise, the second wavelength separation filter 220 may include a third layer 220p configured to transmit (e.g., selectively transmit) light (e.g., incident light) of the second wavelength spectrum (e.g., the incident light in the second wavelength spectrum 900-2) and a fourth layer 220q configured to photoelectrically convert light (e.g., incident light) of at least one of the first or third wavelength spectra (e.g., at least one of 900-1 or 900-3). The third layer 220p may include the aforementioned second colorant configured to transmit of the second wavelength spectrum (e.g., the incident light in the second wavelength spectrum 900-2), and the second colorant may be one type of material (e.g., one type of colorant) or two or more types of material (e.g., two or more types of colorant). The fourth layer 220q may include the aforementioned second photoelectric conversion material configured to absorb incident light of at least one of the first wavelength spectrum or the third wavelength spectrum (e.g., at least one of 900-1 or 900-3) and photoelectrically convert the absorbed light, and the second photoelectric conversion material may be one type of material or two or more types of material. The third layer 220p and the fourth layer 220q independently may further include at least one of a cross-linked polymer or a binder. Herein, the fourth layer 220q is illustrated to be disposed on the third layer 220p but not limited thereto, and the third layer 220p may be disposed on the fourth layer 220q. As shown in FIG. 5, in some example embodiments the third and fourth layers 220p and 220q may be isolated from direct contact with each other, for example by at least an electrode 260.

Likewise, the third wavelength separation filter 230 may include a fifth layer 230p configured to transmit (e.g., selectively transmit) light (e.g., incident light) of the third wavelength spectrum (e.g., the incident light in the third wavelength spectrum 900-3) and a sixth layer 230q configured to photoelectrically convert light (e.g., incident light) of at least one of the first or second wavelength spectra (e.g., at least one of 900-1 or 900-2). The fifth layer 230p may include the aforementioned colorant configured to transmit light of the third wavelength spectrum (e.g., the incident light in the third wavelength spectrum 900-3), and the third colorant may be one type of material (e.g., one type of colorant) or two or more types of material (e.g., two or more types of colorant). The sixth layer 230q may include the aforementioned third photoelectric conversion material configured to absorb incident light of at least one of the first or second wavelength spectra (e.g., at least one of 900-1 or 900-2) and photoelectrically convert the absorbed light, and the third photoelectric conversion material may be one type of material or two or more types of material. The fifth layer 230p and the sixth layer 230q independently may further include at least one of a cross-linked polymer or a binder. Herein, the sixth layer 230q is illustrated to be disposed on the fifth layer 230p but not limited thereto, and the fifth layer 230p may be disposed on the sixth layer 230q. As shown in FIG. 5, in some example embodiments the fifth and sixth layers 230p and 230q may be isolated from direct contact with each other, for example by at least an electrode 260.

As described above, the lower sensor 100 may further include signal processors Sa and Sb, and the upper sensor 200 may further include a pair of electrodes 260 and 270 and optionally auxiliary layers 281 and 282 in first, second and third pixels $PX_{U1}$, $PX_{U2}$, and $PX_{U3}$, respectively. The pair of electrodes 260 and 270 may be disposed to face each other in the center of the second layer 210q, the fourth layer 220q, and the sixth layer 230q, and may be light-transmitting electrodes, respectively. Accordingly, as shown in FIG. 5, the image sensor 300 may include a light-transmitting electrode (e.g., at least one of the electrode(s) 270 or the electrode(s) 260) that is between the first and second layers 210p and 210q, between the third and fourth layers 220p and 220q, and between the fifth and sixth layers 230p and 230q.

The aforementioned image sensor may be applied to various electronic devices including imaging devices, such as smart phones, mobile phones, tablet PCs, laptop PCs, desktop PCs, e-books, navigation devices, TVs, personal digital assistants (PDAs), and PMPs. (portable multimedia player), EDA (enterprise digital assistant), wearable computer, Internet of Things (IoT), Internet of all things (IoE), drone, digital cameras, door locks, safes, automatic teller machines (ATM), security devices, medical devices, or automotive electronic components, but is not limited thereto.

While FIGS. 2-4 illustrate separate photodiodes overlapping separate wavelength separation filters in the vertical direction (e.g., Z direction) that is perpendicular to the upper surface 105a of the semiconductor substrate 105, it will be understood that example embodiments are not limited thereto, and in some example embodiments a photodiode may at least partially overlap multiple wavelength separation filters. For example, with reference to FIG. 4, in some example embodiments the second photodiode 120 may be absent and the first photodiode 110 may extend through both the first and second pixels $PX_{L1}$ and $PX_{L2}$ in the horizontal direction (e.g., X and/or Y directions) and at least partially overlap both the first and second wavelength separation filters 210 and 220 in the vertical direction (e.g., Z direction).

While FIGS. 2-4 illustrate example embodiments where the plurality of pixels $PX_L$ may include a repeating unit pixel group A, and the unit pixel group (e.g., the repeating unit pixel group) may include at least one first pixel $PX_{L1}$, at least one second pixel $PX_{L2}$, and at least one third pixel $PX_{L3}$, and at least one first pixel $PX_{U1}$, at least one second pixel $PX_{U2}$, and at least one third pixel $PX_{U3}$, it will be understood that example embodiments are not limited thereto. For example, in some example embodiments, the third wavelength separation filter 230 may be absent from the image sensor, such that only first and second wavelength separation filters 210 and 220 are present. In some example embodiments, the third photodiode 130 may be absent, such that only first and second photodiodes 110 and 120 are present. As a result, in some example embodiments, the third pixels $PX_{L3}$ and/or $PX_{U3}$ may be absent from the image sensor 300. In some example embodiments, a unit pixel group (e.g., unit pixel group A) may include 4 pixels, including two first pixels $PX_{L1}$ and two second pixels $PX_{L2}$. In some example embodiments, a unit pixel group (e.g., unit pixel group A) may include 4 pixels, including two first pixels $PX_{U1}$ and two second pixels $PX_{U2}$.

For example, in some example embodiments (e.g., embodiments of the image sensor 300 where the third wavelength separate filter 230 and/or third photodiode 130 may be absence), the image sensor 300 may include the first and second wavelength separation filters 210 and 220 as described herein (and may or may not include the first and second photodiodes 110 and 120) and further may or may not include the third wavelength separation filter 230 and/or third photodiode 130.

In some example embodiments, one or more of the wavelength separation filters described herein may be configured to selectively transmit incident light in the visible wavelength spectrum (e.g., all of the visible wavelength spectrum, including red, green, and blue wavelength spectra) and photoelectrically convert incident light in a non-visible wavelength spectrum. A non-visible wavelength spectrum may include an infrared wavelength spectrum (e.g., about 700 nm to about 1 mm), near-infrared wavelength spectrum (e.g., about 750 nm to about 1400 nm), ultraviolet wavelength spectrum (e.g., about 10 nm to about 400 nm), or the like. For example, in some example embodiments, any of the first, second, or third wavelength separation filters 210, 220, or 230 as described herein may be configured to selectively transmit visible incident light (e.g., some or all incident light in the visible wavelength spectrum) and photoelectrically convert incident light in a non-visible (e.g., infrared) wavelength spectrum). Restated, in some example embodiments, at least one of the first wavelength spectrum, second wavelength spectrum, or third wavelength spectrum may be at least partially within a non-visible wavelength spectrum (e.g., a near-infrared wavelength spectrum).

A wavelength separation filter configured to selectively transmit visible incident light (e.g., some or all incident light in the visible wavelength spectrum) and photoelectrically convert incident light in a non-visible (e.g., infrared) wavelength spectrum) may include a photoelectric conversion material that is configured to photoelectrically convert incident light in a non-visible (e.g., infrared) wavelength spectrum). For example, a wavelength separation filter that is configured to selectively transmit all visible incident light and photoelectrically convert at least some infrared incident light (e.g., incident light in a near-infrared wavelength spectrum) may include a photoelectric conversion material that may include one or multiple materials (e.g., a mixture, heterojunction, or the like). Said photoelectric conversion material may include a p-type semiconductor material, an n-type semiconductor material, or a combination thereof. The photoelectric conversion material may include a first material and a second material that collectively form a pn junction. One of the first material or the second material may be a p-type semiconductor, and the other may be an n-type semiconductor. The photoelectric conversion material (e.g., each of the first material and the second material) may be an organic material, an inorganic material, or an organic/inorganic material, respectively, and for example at least one of the first material or the second material may be an organic material. At least one of the first material or the second material may be a light absorbing material, and for example the first material and the second material may be each a light absorbing material.

In some example embodiments, a wavelength separation filter (e.g., the fourth wavelength separation filter 240) that is configured to selectively transmit at least some visible incident light (e.g., some or all incident light in the visible wavelength spectrum) and photoelectrically convert at least some infrared incident light (e.g., incident light in a near-infrared wavelength spectrum) may include one or a combination of a first material that may be represented by Chemical Formula A (Amax: 870 nm, HOMO: 5.1 eV, LUMO: 4.0 eV) and/or a second material represented by C60 (Amax: 450 nm, HOMO: 6.4 eV, LUMO: 4.3 eV).

[Chemical Formula A]

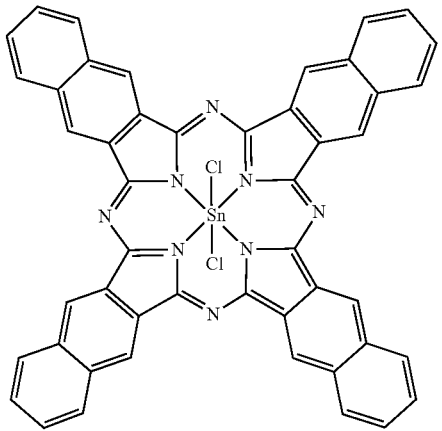

Figure 7:
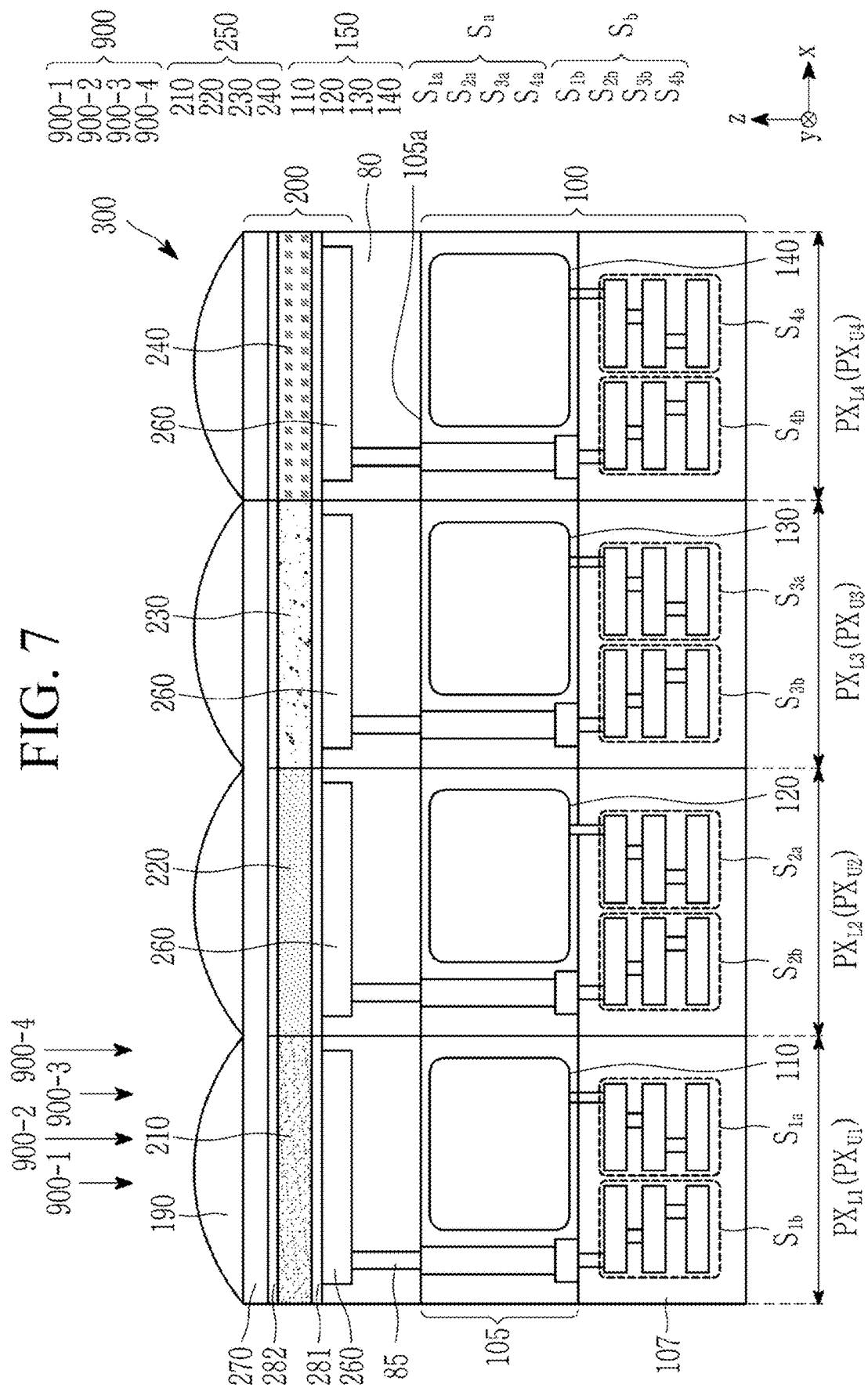
FIG. 7 is a cross-sectional the image sensor of FIG. 1, illustrating an example of first, second, third, and fourth pixels of the image sensor of FIG. 1 according to some example embodiments.
Figure 8:
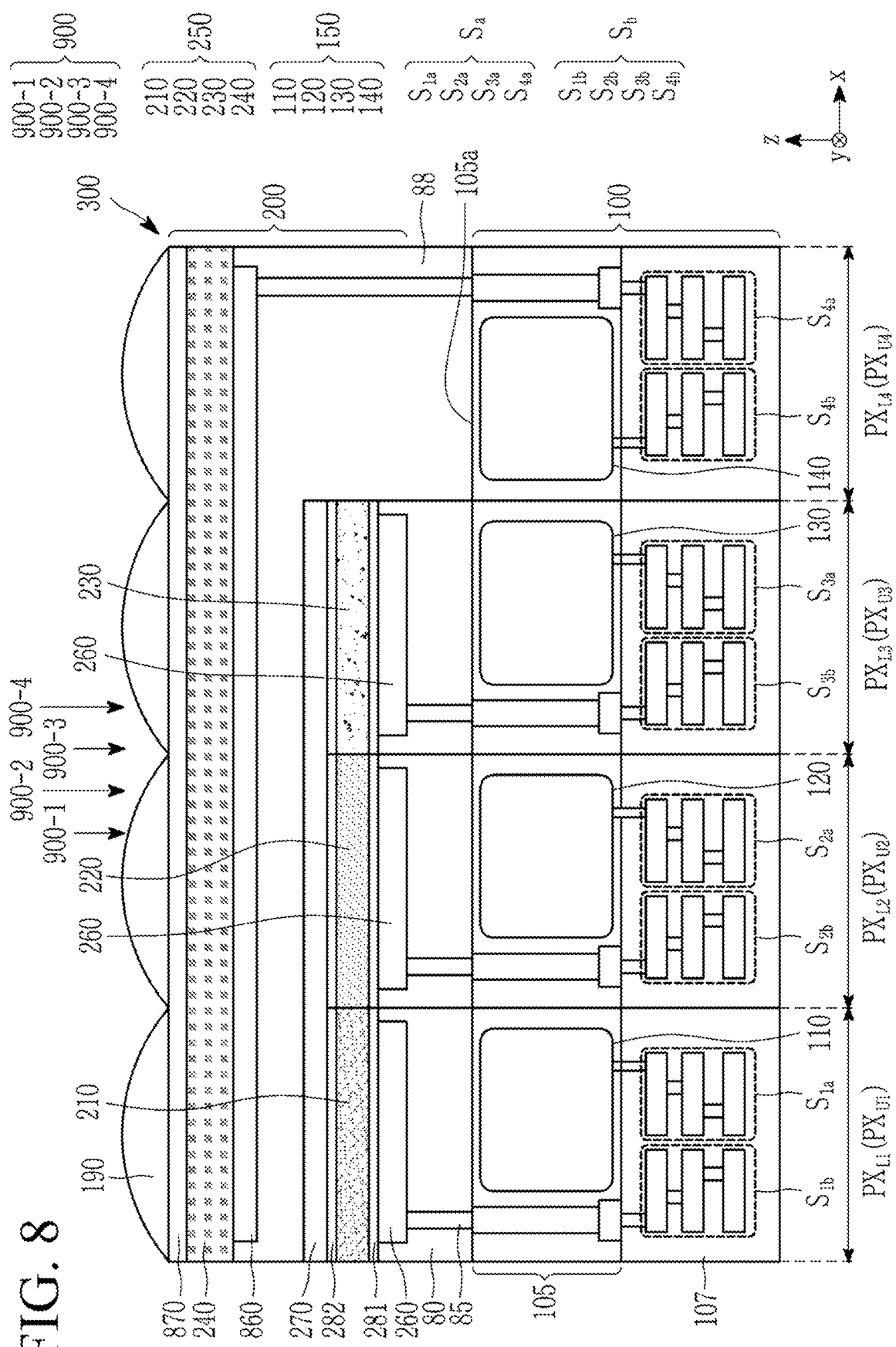
FIG. 8 is a cross-sectional the image sensor of FIG. 1, illustrating an example of first, second, third, and fourth pixels of the image sensor of FIG. 1 according to some example embodiments.

Referring now to FIGS. 7-8, in some example embodiments, the image sensor 300 may include an additional wavelength separation filter, in addition to the first to third wavelength separation filters. In some example embodiments, as shown in at least FIG. 8 below, at least two of the wavelength separation filters may at least partially overlap in the vertical direction extending perpendicular to the upper surface 105a of the semiconductor substrate 105.

FIG. 7 is a cross-sectional the image sensor of FIG. 1, illustrating an example of first, second, third, and fourth pixels of the image sensor of FIG. 1 according to some example embodiments.

As shown in FIG. 7, in some example embodiments an image sensor 300 (e.g., a unit pixel group A) may include, in addition to the first to third pixels $PX_{L1}$ to $PX_{L3}$ and $PX_{U1}$ to $PX_{U3}$, a fourth pixel $PX_{L4}$ and fourth pixel $PX_{U4}$, including a fourth wavelength separation filter 240 and a fourth photodiode 140, where the fourth wavelength separation filter 240 is arranged in the in-plane direction with the first to third wavelength separation filters 210 to 230. It will be understood that, in some example embodiments, the fourth wavelength separation filter 240 or the fourth photodiode 140 may be absent. Accordingly, the wavelength separation filter array 250 may include the first to fourth wavelength separation filters 210 to 240, and the photodiode array 150 may include the first to fourth photodiodes 110 to 140.

In some example embodiments, the fourth wavelength separation filter 240 may be configured to selectively transmit a wavelength spectrum of incident light 900 and photoelectrically convert a wavelength spectrum of incident light 900 differently from the first to third wavelength separation filters 210 to 230.

For example, in some example embodiments, the first wavelength separation filter 210 may be configured to selectively transmit incident light in the first wavelength spectrum 900-1 and photoelectrically convert the incident light in at least one of the second wavelength spectrum or the third wavelength spectrum (e.g., at least one of 900-2 or 900-3), the second wavelength separation filter 220 may be configured to selectively transmit the incident light in the second wavelength spectrum 900-2 and photoelectrically convert the incident light in at least one of the first wavelength spectrum or the third wavelength spectrum (e.g., at least one of 900-1 or 900-3), and the third wavelength separation filter 230 may be configured to selectively transmit the incident light in the third wavelength spectrum 900-3 and photoelectrically convert the incident light in at least one of the first wavelength spectrum or the second wavelength spectrum (e.g., 900-1 or 900-2), where the first, second, and third wavelength spectra are separate wavelength spectra of the visible wavelength spectrum (e.g., blue, green, and red wavelength spectra, respectively), the fourth wavelength separation filter 240 may be configured to selectively transmit incident light in the entire visible wavelength spectrum (e.g., all of 900-1, 900-2, and 900-3) and photoelectrically convert incident light in a fourth wavelength spectrum 900-4 that is at least partially or completely different from the first to third wavelength spectra. For example, the fourth wavelength spectrum may be a near-infrared wavelength spectrum, such that the fourth wavelength separation filter 240 may be configured to photoelectrically convert incident light in the near-infrared wavelength spectrum. In some example embodiments, where the fourth wavelength separation filter 240 is configured to photoelectrically convert incident light in a non-visible wavelength spectrum (e.g., near-infrared wavelength spectrum), the fourth photodiode 140 may be present or absent and, where present, may be configured to absorb (e.g., photoelectrically convert) incident light in the visible wavelength spectrum that passes through the fourth wavelength separation filter 240 (e.g., all of 900-1, 900-2, and 900-3).

As shown in FIG. 7, the image sensor 300 may include, for each given photodiode (e.g., 110, 120, 130, or 140), a first signal processor (e.g., $S_{1a}$, $S_{2a}$, $S_{3a}$, or $S_{4a}$) electrically connected to the given photodiode (e.g., 110, 120, 130, or 140) and a second signal processor (e.g., $S_{1b}$, $S_{2b}$, $S_{3b}$, or $S_{4b}$) electrically connected to the at least one wavelength separation filter (e.g., 210, 220, 230, or 240) that is at least partially overlapped (e.g., in the vertical direction) by the given photodiode (e.g., 110, 120, 130, 140).

FIG. 8 is a cross-sectional the image sensor of FIG. 1, illustrating an example of first, second, third, and fourth pixels of the image sensor of FIG. 1 according to some example embodiments.

As shown in FIG. 8, in some example embodiments at least one of the wavelength separation filters of the wavelength separation filter array 250 may at least partially overlap another wavelength separation filter of the wavelength separation filter array 250 in the vertical direction (e.g., Z direction). The wavelength separation filter that overlaps another wavelength separation filter and is between the other wavelength separation filter and the incident light side of the image sensor (e.g., the focusing lenses 190) may be configured to selectively transmit incident light to the other wavelength separation filter.

Referring to FIG. 8, and unlike some example embodiments, including the example embodiments shown in FIG. 7, the fourth wavelength separation filter 240 extends through the first to fourth pixels $PX_{U1}$ to $PX_{U4}$ and overlaps the first to fourth pixels $PX_{L1}$ to $PX_{L4}$. As shown, the fourth wavelength separation filter 240 overlaps the first to third wavelength separation filters 210 to 230 in the vertical direction, such that the first to third wavelength separation filters 210 to 230 are between the fourth wavelength separation filter 240 and the semiconductor substrate 105 in the vertical direction.

In some example embodiments, the fourth wavelength separation filter 240 may be configured to selectively transmit incident light in the entire visible wavelength spectrum (e.g., all of 900-1, 900-2, and 900-3) and photoelectrically convert incident light in a fourth wavelength spectrum 900-4, while the first to third wavelength separation filters 210, 220, and 230 may each be configured to selectively transmit various wavelength spectra of incident light (e.g., one or more of 900-1 to 900-3) that are different from the fourth wavelength spectrum and photoelectrically convert one or more various wavelength spectra of incident light (e.g., one or more of 900-1 to 900-3) that are different from the fourth wavelength spectrum, where the fourth wavelength spectrum may be a non-visible wavelength spectrum (e.g., near-infrared wavelength spectrum) while the first to third wavelength spectra may be partially or completely different visible wavelength spectra that are included in the visible wavelength spectrum (e.g., blue, green, and red wavelength spectra, respectively). The fourth wavelength separation filter 240 may thus at least partially prevent near-infrared light from reaching the first to fourth wavelength separation filters 210 to 230.

While FIG. 8 illustrates the overlapping fourth wavelength separation filter 240 as overlapping the first to third wavelength separation filters 210 to 230 on the incident light side, it will be understood that example embodiments are not limited thereto. For example, in some example embodiments the fourth wavelength separation filter 240 may overlap the first to third wavelength separation filters 210 to 230 in the vertical direction such that the fourth wavelength separation filter is between the semiconductor substrate 105 and the first to third wavelength separation filters 210 to 230 in the vertical direction.

Still referring to FIG. 8, in some example embodiments, the image sensor 300 may include an additional insulation layer 88 that may have a same or different material composition as the insulation layer 80, and the additional insulation layer 88 may at least partially extend through one or more pixels of the upper sensor 200 to interpose between vertically-overlapping wavelength separation filters, so as to isolate (e.g., physically and/or electrically) said vertically-overlapping wavelength separation filters and/or associated electrodes from contact with each other. As also shown, the image sensor 300 may include an electrode 870 extending over the fourth wavelength separation filter 240 (and thus, in some example embodiments, extending through the first to fourth pixels $PX_{U1}$ to $PX_{U4}$) and which may have a same or different composition as the electrode 270. As also shown, the image sensor 300 may include an electrode 860 extending under the fourth wavelength separation filter 240 (and thus, in some example embodiments, extending through the first to fourth pixels $PX_{U1}$ to $PX_{U4}$) and which may have a same or different composition as the electrode 260. While not shown in FIG. 8, auxiliary layers similar to the auxiliary layers 281 and 282 may be present between the respective fourth wavelength separation filter 240 and a separate one of the electrodes 860 and 870.

While the overlapping wavelength separation filters are shown in FIG. 8 with regard to an image sensor including a wavelength separation filter array 250 having first to fourth wavelength separation filters 210 to 240, it will be understood that an image sensor 300 may include omit the fourth wavelength separation filter 240 and/or third wavelength separation filter (e.g., omit the third and fourth pixels), and one of the first or second wavelength separation filters 210 or 200 may at least partially overlap the other one of the first or second wavelength separation filters 210 or 200 in the vertical direction (e.g., Z direction).

Figure 6:
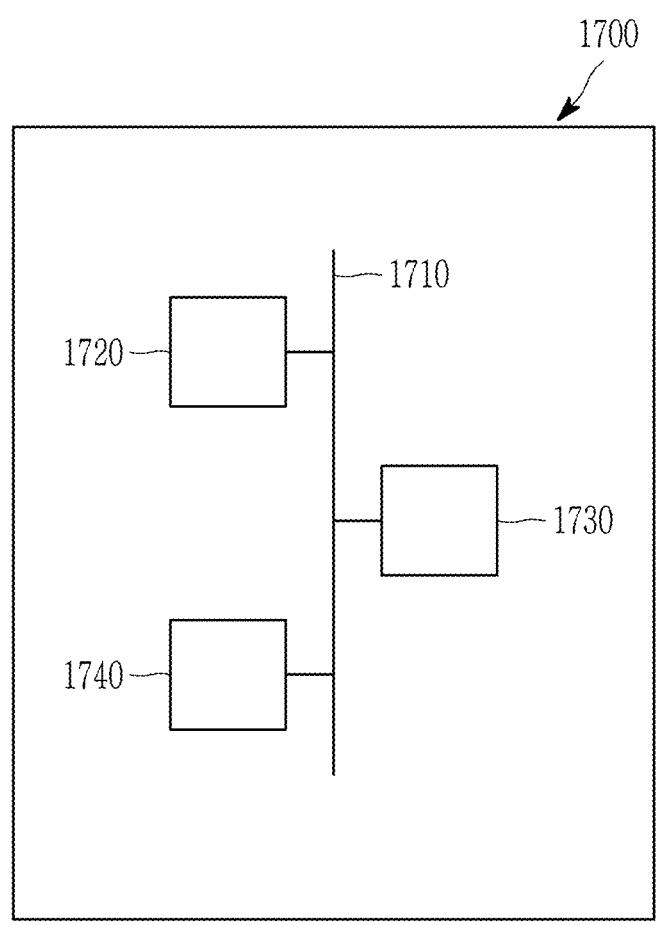
FIG. 6 is a schematic view of an electronic device according to some example embodiments.

FIG. 6 is a schematic view of an electronic device according to some example embodiments.

Referring to FIG. 6, an electronic device 1700 may include a processor 1720, a memory 1730, and an image sensor 1740 that are electrically coupled together via a bus 1710. The image sensor 1740 may be any of the image sensors according to any of the example embodiments (e.g., any example embodiments of image sensor 300 as described herein with reference to FIGS. 1-5 and 7-8). The memory 1730, which may be a non-transitory computer readable medium, may store a program of instructions. The processor 1720 may execute the stored program of instructions to perform one or more functions. For example, the processor 1720 may be configured to process electrical signals generated by the image sensor 1740. The processor 1720 may be configured to generate an output (e.g., an image to be displayed on a display interface) based on such as processing.

In some example embodiments, some or all of the devices and/or elements thereof as described herein with reference to any of the drawings (including without limitation the elements of the electronic device 1700) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), an application processor (AP), a microcomputer, a field programmable gate array (FPGA), and programmable logic unit, a microprocessor, application-specific integrated circuit (ASIC), a neural network processing unit (NPU), an Electronic Control Unit (ECU), and the like. In some example embodiments, the processing circuitry may include a non-transitory computer readable storage device, for example a solid state drive (SSD), storing a program of instructions, and a processor (e.g., CPU) configured to execute the program of instructions to implement the functionality of any of the elements of the devices and/or elements thereof as described herein (including without limitation some or all of the electronic device 1700 shown in FIG. 6).

While this disclosure has been described in connection with what is presently considered to be practical example embodiments, it is to be understood that the inventive concepts are not limited to the disclosed example embodiments. On the contrary, the inventive concepts are intended to cover various modifications and equivalent arrangements included within the spirit and scope of the appended claims.

What is claimed is:

1. An image sensor configured to obtain an image based on combining image signals obtained based on photoelectric conversion of incident light in a first wavelength spectrum of a visible wavelength spectrum, a second wavelength spectrum of the visible wavelength spectrum, and a third wavelength spectrum of the visible wavelength spectrum, the image sensor comprising:
   a substrate; and
   a plurality of wavelength separation filters on the substrate, the plurality of wavelength separation filters arranged along an in-plane direction of the substrate, the in-plane direction of the substrate extending in parallel with an upper surface of the substrate,
   wherein the plurality of wavelength separation filters includes
      a first wavelength separation filter configured to
         selectively transmit the incident light in the first wavelength spectrum, and
         photoelectrically convert the incident light in at least one of the second wavelength spectrum or the third wavelength spectrum,
      a second wavelength separation filter configured to
         selectively transmit the incident light in the second wavelength spectrum, and
         photoelectrically convert the incident light in at least one of the first wavelength spectrum or the third wavelength spectrum, and
      a third wavelength separation filter configured to
         selectively transmit the incident light in the third wavelength spectrum, and
         photoelectrically convert the incident light in at least one of the first wavelength spectrum or the second wavelength spectrum.

2. The image sensor of claim 1, wherein each of the first wavelength separation filter, the second wavelength separation filter, and the third wavelength separation filter includes one or more photoelectric conversion materials.

3. The image sensor of claim 2, wherein
   the first wavelength separation filter includes at least one first photoelectric conversion material configured to absorb the incident light in the at least one of the second wavelength spectrum or the third wavelength spectrum,
   the second wavelength separation filter includes at least one second photoelectric conversion material configured to absorb the incident light in the at least one of the first wavelength spectrum or the third wavelength spectrum,
   the third wavelength separation filter includes at least one third photoelectric conversion material configured to absorb the incident light in the at least one of the first wavelength spectrum or the second wavelength spectrum, and
   the first photoelectric conversion material, the second photoelectric conversion material, and the third photoelectric conversion material independently include
   a p-type semiconductor,
   an n-type semiconductor, or
   a combination of a p-type semiconductor and an n-type semiconductor.

4. The image sensor of claim 2, wherein
each of the first wavelength separation filter, the second wavelength separation filter and the third wavelength separation filter further includes a colorant.

5. The image sensor of claim 4, wherein
the first wavelength separation filter includes at least one first colorant configured to selectively transmit the incident light in the first wavelength spectrum,
the second wavelength separation filter includes at least one second colorant configured to selectively transmit the incident light in the second wavelength spectrum, and
the third wavelength separation filter includes at least one third colorant configured to selectively transmit the incident light in the third wavelength spectrum.

6. The image sensor of claim 4, wherein
each of the first wavelength separation filter, the second wavelength separation filter and the third wavelength separation filter further includes at least one of a cross-linked polymer or a binder.

7. The image sensor of claim 4, wherein
the first wavelength separation filter includes at least one first colorant configured to selectively transmit the incident light in the first wavelength spectrum and at least one first photoelectric conversion material configured to absorb the incident light in the at least one of the second wavelength spectrum or the third wavelength spectrum,
the second wavelength separation filter includes at least one second colorant configured to selectively transmit the incident light in the second wavelength spectrum and at least one second photoelectric conversion material configured to absorb the incident light in the at least one of the first wavelength spectrum or the third wavelength spectrum, and the third wavelength separation filter includes at least one third colorant configured to selectively transmit the incident light in the third wavelength spectrum and at least one third photoelectric conversion material configured to absorb the incident light in the at least one of the first wavelength spectrum or the second wavelength spectrum.

8. The image sensor of claim 7, wherein
the first wavelength separation filter includes a mixture of the first colorant and the first photoelectric conversion material,
the second wavelength separation filter includes a mixture of the second colorant and the second photoelectric conversion material, and
the third wavelength separation filter includes a mixture of the third colorant and the third photoelectric conversion material.

9. The image sensor of claim 7, wherein
the first wavelength separation filter includes a first layer that includes the first colorant and a second layer that includes the first photoelectric conversion material,
the second wavelength separation filter includes a third layer that includes the second colorant and a fourth layer that includes the second photoelectric conversion material, and
the third wavelength separation filter includes a fifth layer that includes the third colorant and a sixth layer that includes the third photoelectric conversion material.

10. The image sensor of claim 9, further comprising:
a light-transmitting electrode that is
between the first layer and the second layer,
between the third layer and the fourth layer, and
between the fifth layer and the sixth layer.

11. The image sensor of claim 1, further comprising:
an electrode configured to transfer electric charges generated based on photoelectric conversion in the plurality of wavelength separation filters.

12. The image sensor of claim 1, further comprising:
a photodiode within the substrate, the photodiode overlapping at least one wavelength separation filter of the plurality of wavelength separation filters in a vertical direction that extends perpendicular to the upper surface of the substrate,
a first signal processor electrically connected to the photodiode, and
a second signal processor electrically connected to the at least one wavelength separation filter.

13. The image sensor of claim 12, wherein the first signal processor and the second signal processor are configured to generate separate, respective image signals that are configured to be combined to generate the image.

14. The image sensor of claim 1, wherein
the first wavelength separation filter is configured to selectively transmit the incident light in a blue wavelength spectrum and photoelectrically convert the incident light in both a green wavelength spectrum and a red wavelength spectrum,
the second wavelength separation filter is configured to selectively transmit the incident light in the green wavelength spectrum and photoelectrically convert the incident light in both the blue wavelength spectrum and the red wavelength spectrum, and the third wavelength separation filter is configured to selectively transmit the incident light in the red wavelength spectrum and photoelectrically convert the incident light in both the blue wavelength spectrum and the green wavelength spectrum.

15. The image sensor of claim 1, wherein
the first wavelength separation filter is configured to photoelectrically convert the incident light in a green wavelength spectrum and selectively transmit the incident light in both a blue wavelength spectrum and a red wavelength spectrum,
the second wavelength separation filter is configured to photoelectrically convert the incident light in the red wavelength spectrum and selectively transmit the incident light in both the green wavelength spectrum and the blue wavelength spectrum, and
the third wavelength separation filter is configured to photoelectrically convert the incident light in the blue wavelength spectrum and selectively transmit the incident light in both the red wavelength spectrum and the green wavelength spectrum.

16. The image sensor of claim 1, wherein
the first wavelength separation filter is configured to photoelectrically convert the incident light in a red wavelength spectrum and selectively transmit the incident light in both a blue wavelength spectrum and a green wavelength spectrum,
the second wavelength separation filter is configured to photoelectrically convert the incident light in the blue wavelength spectrum and selectively transmit the incident light in both the green wavelength spectrum and the red wavelength spectrum, and
the third wavelength separation filter is configured to photoelectrically convert the incident light in the green wavelength spectrum and selectively transmit the incident light in both the blue wavelength spectrum and the red wavelength spectrum.

17. An electronic device comprising the image sensor of claim 1.

18. An image sensor, comprising:
a first sensor including first, second, and third photodiodes; and
a second sensor, the second sensor including
a first wavelength separation filter overlapping the first photodiode in a vertical direction extending perpendicular to an upper surface of a substrate of the image sensor,
a second wavelength separation filter overlapping the second photodiode in the vertical direction, and
a third wavelength separation filter overlapping the third photodiode in the vertical direction,
wherein the first wavelength separation filter includes at least one first colorant configured to selectively transmit incident light in a first wavelength spectrum and at least one first photoelectric conversion material configured to absorb the incident light in at least one of a second wavelength spectrum or a third wavelength spectrum,
wherein the second wavelength separation filter includes at least one second colorant configured to selectively transmit the incident light in the second wavelength spectrum and at least one second photoelectric conversion material configured to absorb the incident light in at least one of the first wavelength spectrum or the third wavelength spectrum,
wherein the third wavelength separation filter includes at least one third colorant configured to selectively transmit the incident light in the third wavelength spectrum and at least one third photoelectric conversion material configured to absorb the incident light in at least one of the first wavelength spectrum or the second wavelength spectrum, and the first wavelength spectrum, the second wavelength spectrum, and the third wavelength spectrum are different wavelength spectra of a visible wavelength spectrum.

19. The image sensor of claim 18, wherein
the image sensor includes a repeating unit pixel group, and
the repeating unit pixel group includes the first wavelength separation filter, the second wavelength separation filter, and the third wavelength separation filter.

20. The image sensor of claim 18, wherein each of the first, second, and third photoelectric conversion materials includes
a p-type semiconductor,
an n-type semiconductor, or
a combination of a p-type semiconductor and an n-type semiconductor.

21. The image sensor of claim 18, wherein
the first wavelength separation filter includes a mixture of the first colorant and the first photoelectric conversion material,
the second wavelength separation filter includes a mixture of the second colorant and the second photoelectric conversion material, and
the third wavelength separation filter includes a mixture of the third colorant and the third photoelectric conversion material.

22. The image sensor of claim 18, wherein
the first wavelength separation filter includes
a first layer including the first colorant, and
a second layer including the first photoelectric conversion material,
the second wavelength separation filter includes
a third layer including the second colorant, and
a fourth layer including the second photoelectric conversion material, and
the third wavelength separation filter includes
a fifth layer including the third colorant, and
a sixth layer including the third photoelectric conversion material.

23. The image sensor of claim 22, further comprising:
a light-transmitting electrode that is
between the first layer and the second layer,
between the third layer and the fourth layer, and
between the fifth layer and the sixth layer.

24. The image sensor of claim 18, wherein
the first wavelength separation filter is configured to photoelectrically convert the incident light in both a green wavelength spectrum and a red wavelength spectrum,
the first photodiode is configured to photoelectrically convert the incident light in a blue wavelength spectrum,
the second wavelength separation filter is configured to photoelectrically convert the incident light in both the blue wavelength spectrum and the red wavelength spectrum,
the second photodiode is configured to photoelectrically convert the incident light in the green wavelength spectrum, the third wavelength separation filter is configured to photoelectrically convert the incident light in both the blue wavelength spectrum and the green wavelength spectrum, and
the third photodiode is configured to photoelectrically convert the incident light in the red wavelength spectrum.

25. The image sensor of claim 18, wherein
the first wavelength separation filter is configured to photoelectrically convert the incident light in a green wavelength spectrum,
the first photodiode is configured to photoelectrically convert the incident light in both a blue wavelength spectrum and a red wavelength spectrum,
the second wavelength separation filter is configured to photoelectrically convert the incident light in the red wavelength spectrum,
the second photodiode is configured to photoelectrically convert the incident light in both the green wavelength spectrum and the blue wavelength spectrum,
the third wavelength separation filter is configured to photoelectrically convert the incident light in the blue wavelength spectrum, and
the third photodiode is configured to photoelectrically convert the incident light in both the red wavelength spectrum and the green wavelength spectrum.

26. The image sensor of claim 18, wherein
the first wavelength separation filter is configured to photoelectrically convert the incident light in a red wavelength spectrum,
the first photodiode is configured to photoelectrically convert the incident light in a combination of a blue wavelength spectrum and a green wavelength spectrum,
the second wavelength separation filter is configured to photoelectrically convert the incident light in the blue wavelength spectrum,
the second photodiode is configured to photoelectrically convert the incident light in a combination of the green wavelength spectrum and the red wavelength spectrum,
the third wavelength separation filter is configured to photoelectrically convert the incident light in the green wavelength spectrum, and
the third photodiode is configured to photoelectrically convert the incident light in a combination of the blue wavelength spectrum and the red wavelength spectrum.

27. An electronic device comprising the image sensor of claim 18.

28. An image sensor, comprising:
a substrate; and
a plurality of wavelength separation filters on the substrate, the plurality of wavelength separation filters including
a first wavelength separation filter configured to
selectively transmit incident light in a first wavelength spectrum, and
photoelectrically convert the incident light in at least one of a second wavelength spectrum or a third wavelength spectrum, and
a second wavelength separation filter configured to
selectively transmit the incident light in the second wavelength spectrum, and
photoelectrically convert the incident light in at least one of the first wavelength spectrum or the third wavelength spectrum.

29. The image sensor of claim 28, wherein the plurality of wavelength separation filters further includes a third wavelength separation filter configured to
- selectively transmit the incident light in the third wavelength spectrum, and
- photoelectrically convert the incident light in at least one of the first wavelength spectrum or the second wavelength spectrum.

30. The image sensor of claim 28, wherein the first wavelength spectrum and the second wavelength spectrum are within a visible wavelength spectrum.

31. The image sensor of claim 28, wherein at least one of the first wavelength spectrum or the second wavelength spectrum is at least partially within a non-visible wavelength spectrum.

32. The image sensor of claim 28, further comprising:
- a photodiode within in the substrate,
- a first signal processor electrically connected to the photodiode, and
- a second signal processor electrically connected to at least one wavelength separation filter of the plurality of wavelength separation filters, wherein
- the photodiode at least partially overlaps the at least one wavelength separation filter in a vertical direction that extends perpendicular to an upper surface of the substrate.

33. The image sensor of claim 32, wherein the photodiode at least partially overlaps both the first wavelength separation filter and the second wavelength separation filter.

34. The image sensor of claim 28, wherein the second wavelength separation filter at least partially overlaps the first wavelength separation filter in a vertical direction that extends perpendicular to an upper surface of the substrate.

* * * * *